(12) United States Patent
Tamura

(10) Patent No.: US 12,082,369 B2
(45) Date of Patent: Sep. 3, 2024

(54) HEAT SINK AND SINK MANUFACTURING METHOD

(71) Applicant: Mitsubishi Electric Corporation, Tokyo (JP)

(72) Inventor: Masayoshi Tamura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 163 days.

(21) Appl. No.: 17/762,249

(22) PCT Filed: Nov. 4, 2020

(86) PCT No.: PCT/JP2020/041164
§ 371 (c)(1),
(2) Date: Mar. 21, 2022

(87) PCT Pub. No.: WO2021/111791
PCT Pub. Date: Jun. 10, 2021

(65) Prior Publication Data
US 2022/0346270 A1 Oct. 27, 2022

(30) Foreign Application Priority Data
Dec. 6, 2019 (JP) .................................. 2019-221661

(51) Int. Cl.
*H05K 7/20* (2006.01)
*F28D 1/047* (2006.01)
(Continued)

(52) U.S. Cl.
CPC .......... *H05K 7/20254* (2013.01); *F28F 13/12* (2013.01); *H01L 23/473* (2013.01);
(Continued)

(58) Field of Classification Search
CPC ..... H01L 23/473; F28D 7/024; F28D 1/0472; F28F 1/36; F28F 13/12; H05K 7/20254; Y10T 29/49353
See application file for complete search history.

(56) References Cited

U.S. PATENT DOCUMENTS 311,839 A * 2/1885 Kirkaldy ................. F28D 7/024
165/163
324,120 A * 8/1885 Kirkaldy ................. F28D 7/024
122/249
(Continued)

FOREIGN PATENT DOCUMENTS

CN 109458862 A 3/2019
EP 2677260 A1 12/2013
(Continued)

OTHER PUBLICATIONS

International Search Report (PCT/ISA/210) with translation and Written Opinion (PCT/ISA/237) mailed on Jan. 19, 2021, by the Japan Patent Office as the International Searching Authority for International Application No. PCT/JP2020/041164. (9 pages).
(Continued)

*Primary Examiner* — Robert J Hoffberg
(74) *Attorney, Agent, or Firm* — BUCHANAN INGERSOLL & ROONEY PC

(57) ABSTRACT

A heat sink includes a main body and multiple circular pipes. The main body is in contact with at least one heat emitter. The circular pipes are disposed inside the main body. The circular pipes extend in a shape of helices and are configured to convey refrigerant. The circular pipes are arranged such that the central axes of the helices are adjacent. Each two of the circular pipes of which the central axes of the helices are adjacent to each other are intertwined with each other.

19 Claims, 29 Drawing Sheets

(51) Int. Cl.
*F28F 13/12* (2006.01)
*H01L 23/473* (2006.01)
*F28D 7/02* (2006.01)

(52) U.S. Cl.
CPC ....... H05K 7/20927 (2013.01); *F28D 1/0472* (2013.01); *F28D 7/024* (2013.01); *Y10T 29/49353* (2015.01)

(56) References Cited

U.S. PATENT DOCUMENTS

| | | | | |
|---|---|---|---|---|
| 1,544,929 | A * | 7/1925 | Pack | B22D 15/02 164/36 |
| 4,154,296 | A * | 5/1979 | Fijas | F28F 1/32 165/184 |
| 4,209,061 | A * | 6/1980 | Schwemin | F28F 13/06 165/10 |
| 4,589,481 | A * | 5/1986 | Mansson | F28D 7/024 165/910 |
| 4,619,317 | A * | 10/1986 | Disselbeck | F24S 20/40 165/DIG. 405 |
| 5,165,472 | A * | 11/1992 | Cloutier | F24H 9/133 165/163 |
| 5,746,269 | A * | 5/1998 | Torii | F28D 17/02 165/4 |
| 5,960,835 | A * | 10/1999 | Izaki | C23C 4/16 138/DIG. 6 |
| 6,615,911 | B1 * | 9/2003 | Bhatti | F28F 7/02 257/E23.098 |
| 8,000,103 | B2 * | 8/2011 | Lipp | F28F 9/002 165/185 |
| 8,598,702 | B2 * | 12/2013 | Kwak | H05K 7/20927 361/677 |
| 11,077,270 | B2 * | 8/2021 | Magin | A61F 2/0077 |
| 11,112,183 | B2 * | 9/2021 | Turney | F28F 1/025 |
| 11,444,004 | B2 * | 9/2022 | Kato | H01L 23/40 |
| 11,747,094 | B2 * | 9/2023 | Stoia | F28F 21/062 165/10 |
| 2010/0155040 | A1 * | 6/2010 | Hoffmann | F28F 1/22 165/180 |
| 2018/0283795 | A1 * | 10/2018 | Cerny | F28F 1/12 |
| 2019/0353434 | A1 | 11/2019 | Arai et al. | |
| 2021/0388308 | A1 * | 12/2021 | Orozco | C12M 47/12 |
| 2024/0074107 | A1 * | 2/2024 | Bauduin | H01L 23/473 |

FOREIGN PATENT DOCUMENTS

| | | |
|---|---|---|
| JP | 2009198043 A | 9/2009 |
| JP | 2009-262440 A | 11/2009 |
| JP | 2017069518 A | 4/2017 |
| JP | 2019201101 A | 11/2019 |
| WO | WO-2023079608 A1 * | 5/2023 |

OTHER PUBLICATIONS

First Office Action dated Apr. 30, 2024, issued in the corresponding Chinese Patent Application No. 202080081893.0, 20 pages including 10 pages of English Translation.

Office Action issued by the German Patent and Trademark Office on Jul. 7, 2024 in corresponding DE Patent Application No. 11 2020 005 982.0; 8 Pages (including 3 pages of English Translation).

* cited by examiner

HEAT SINK AND SINK MANUFACTURING METHOD

TECHNICAL FIELD

The present disclosure relates to a heat sink and a method of manufacturing the same.

BACKGROUND ART

Some heat sinks are of a liquid-cooled type, which use refrigerant to cool main bodies in contact with heat emitters to be cooled and thereby cool the heat emitters. Such liquid-cooled heat sinks are provided with flow paths inside the main bodies to convey the refrigerant.

For example, Patent Literature 1 discloses a heat sink provided with multiple helical flow paths inside a main body.

CITATION LIST

Patent Literature

Patent Literature 1: Unexamined Japanese Patent Application Publication No. 2017-69518

SUMMARY OF INVENTION

Technical Problem

In a heat sink, as the areas of the inner walls of flow paths increase, the flow paths become more readily release heat to the refrigerant flowing in the flow paths. That is, the inner walls of the flow paths preferably have larger areas in order to improve the heat release efficiency.

Unfortunately, in the heat sink disclosed in Patent Literature 1, the central axes of the helical flow paths are parallel to one another and arranged away from each other. This structure makes it difficult to arrange the flow paths with a high density inside the main body. The structure thus cannot readily improve the heat release efficiency by increasing the areas of the inner walls of the flow paths.

An objective of the present disclosure, which has been accomplished to solve the above problem, is to provide a heat sink having an improved heat release efficiency and a method of manufacturing the heat sink.

Solution to Problem

In order to achieve the above objective, a heat sink according to an aspect of the present disclosure includes: a main body in contact with at least one heat emitter; and a plurality of flow paths disposed inside the main body, extending in a shape of helices, and configured to covey refrigerant. The plurality of flow paths are arranged such that central axes of the helices are adjacent. Each two of the plurality of flow paths of which the central axes of the helices are adjacent to each other are intertwined with each other.

Advantageous Effects of Invention

According to an aspect of the present disclosure, since each two of the plurality of flow paths of which the central axes of the helices are adjacent to each other are intertwined with each other, the plurality of flow paths inside the main body have a high density. This structure increases the surface areas of the entire flow paths. The heat sink therefore has an improved heat release efficiency.

DESCRIPTION OF EMBODIMENTS

Figure 1:
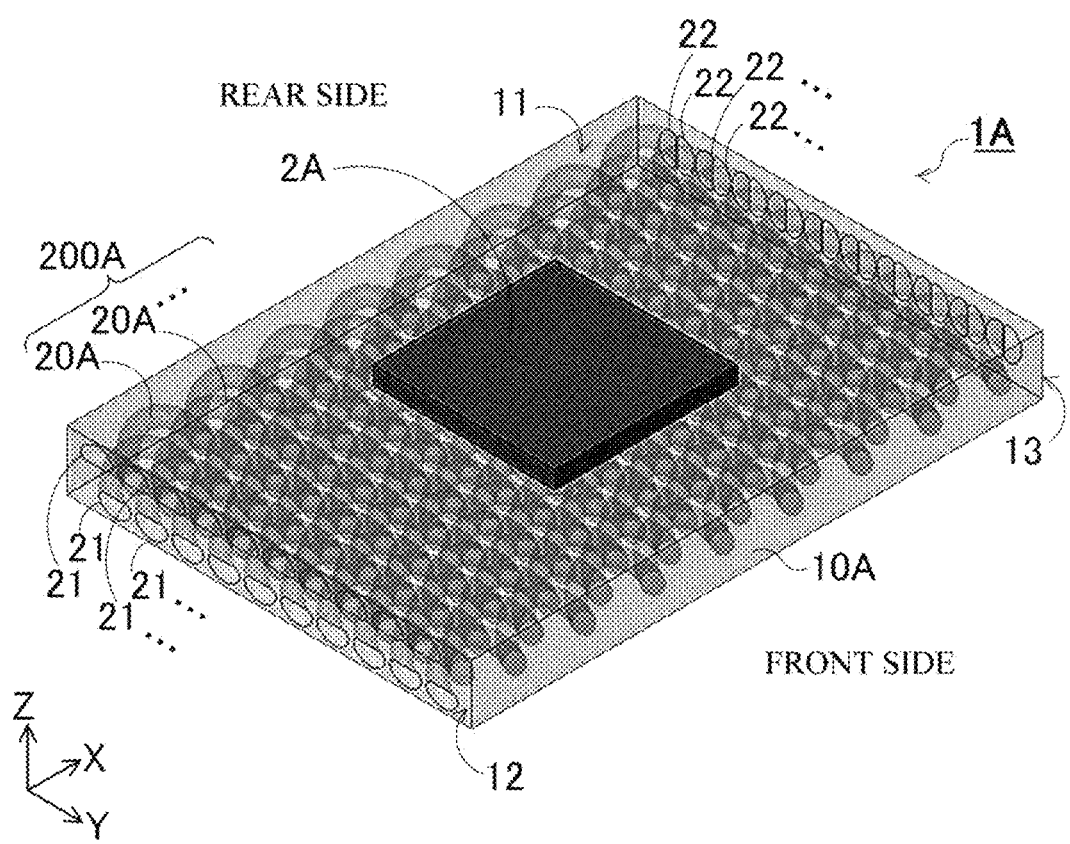
FIG. 1 is a perspective view of a heat sink according to Embodiment 1 of the present disclosure.

A heat sink and a method of manufacturing the heat sink according to embodiments of the present disclosure are described in detail below with reference to the accompanying drawings. In the drawings, the components identical or corresponding to each other are provided with the same reference symbol. In the orthogonal coordinate system XYZ illustrated in the drawings, a main body included in the heat sink is disposed such that the surface in contact with a heat emitter faces upward, refrigerant supply ports provided in the main body face the left side, and refrigerant discharge ports face the right side. In this coordinate system, the left-right direction corresponds to the X direction, the up-down direction corresponds to the Z direction, the direction orthogonal to the Z and X axes corresponds to the Y axis. The following description refers to this coordinate system as appropriate.

Embodiment 1

A heat sink according to Embodiment 1 is a liquid-cooled heat sink including a main body provided with flow paths for conveying refrigerant. In this heat sink, a net-like circular pipe array made of multiple circular pipes define flow paths. The following description is first directed to an entire configuration of the heat sink with reference to FIGS. 1 and 2A to 2C. The description is then directed to a configuration of the net-like circular pipe array with reference to FIGS. 3 to 7.

Figure 2A:
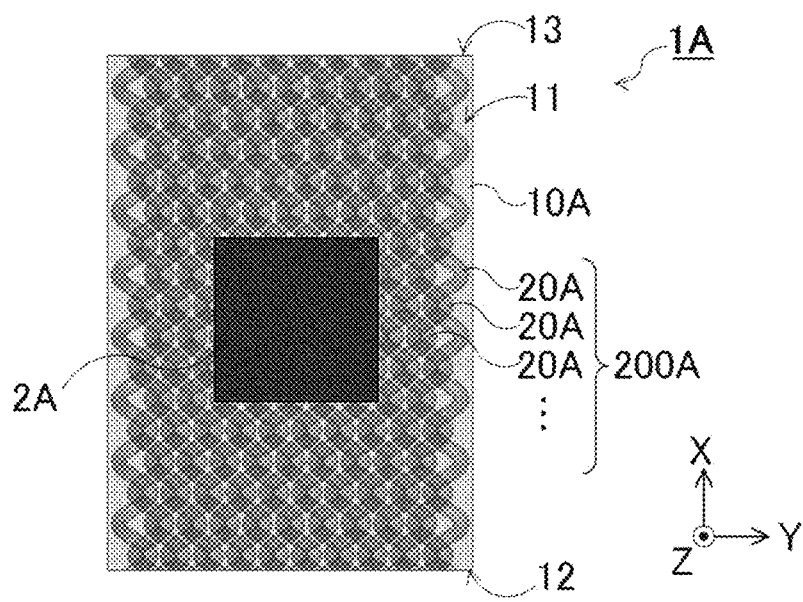
FIG. 2A is a top view of the heat sink according to Embodiment 1 of the present disclosure.
Figure 2B:
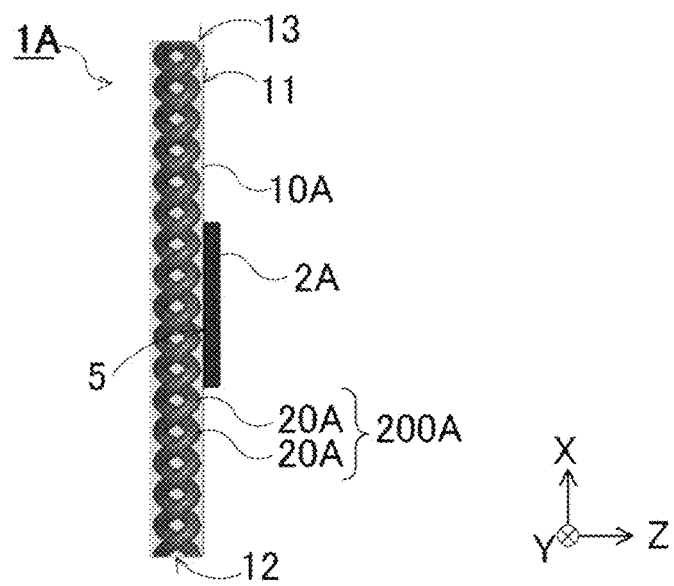
FIG. 2B is a rear view of the heat sink according to Embodiment 1 of the present disclosure.
Figure 2C:
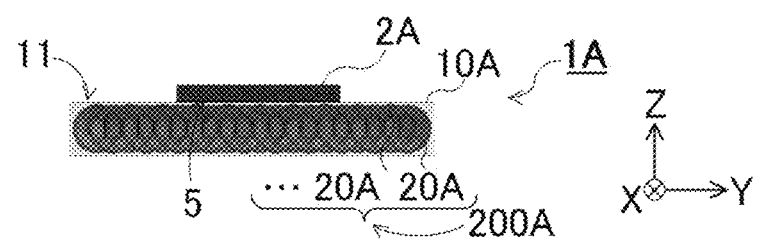
FIG. 2C is a left-side view of the heat sink according to Embodiment 1 of the present disclosure.

FIG. 1 is a perspective view of a heat sink 1A according to Embodiment 1 of the present disclosure. FIGS. 2A to 2C are top, front, and left-side views of the heat sink 1A. FIGS. 1 and 2A to 2C illustrate a main body 10A in translucent gray so as to expose circular pipes 20A therein in order to facilitate an understanding.

As illustrated in FIG. 1, the heat sink 1A includes the main body 10A on which a heat emitter 2A to be cooled is mounted.

The heat emitter 2A is a power semiconductor device including a semiconductor chip made of Si, SiC, or GaN, for example. As illustrated in FIGS. 1 and 2A, the heat emitter 2A has a shape of a rectangular flat plate as viewed from the top. The heat emitter 2A thus has a flat lower surface 5, as illustrated in FIGS. 2B and 2C.

In order to receive this heat emitter 2A thereon, the main body 10A has a shape of a rectangular parallelepiped like a plate, as illustrated in FIGS. 1 and 2A to 2C. The main body 10A has an upper surface portion 11 larger than the lower surface 5 of the heat emitter 2A. The upper surface portion 11 is a flat surface and thus has a large contact area with the heat emitter 2A.

The mounting of the heat emitter 2A on the upper surface portion 11 brings the lower surface 5 of the heat emitter 2A into contact with the upper surface portion 11. The heat from the heat emitter 2A is therefore transferred via the upper surface portion 11 to the main body 10A.

The main body 10A is made of a metal material, such as aluminum alloy or copper alloy, having a high thermal conductivity, so as to transfer the heat from the heat emitter 2A to the inside of the main body 10A. The main body 10A is a solid body made of this metal material. The main body 10A can therefore transfer the heat from the heat emitter 2A to the inside and the entire region of the main body 10A. The main body 10A then releases the heat transferred from the heat emitter 2A to the air in contact with the surfaces of the main body 10A. The main body 10A thereby cools the heat emitter 2A.

Since the main body 10A is made of the metal material and has a shape of a block, the main body 10A is also called a metal block or simply called a block.

Unfortunately, the heat release from the main body 10A to the air may fail to achieve sufficient cooling of the heat emitter 2A. In an exemplary case where the heat emitter 2A is a power semiconductor device having a shrunk configuration, the heat emitter 2A readily reaches a high temperature because of the high density of the circuits within the device. In such a case, the main body 10A cannot sufficiently cool the heat emitter 2A even after releasing the heat to the air.

In order to solve this problem, the main body 10A is provided with multiple flow paths therein that convey refrigerant to improve the heat release performance.

In detail, the multiple circular pipes 20A extend in the main body 10A to improve the heat release efficiency, as illustrated in FIG. 1. These circular pipes 20A configure a circular pipe array 200A having multiple flow paths.

A configuration of the circular pipe array 200A is described below with reference to FIGS. 3 to 7.

Figure 3:
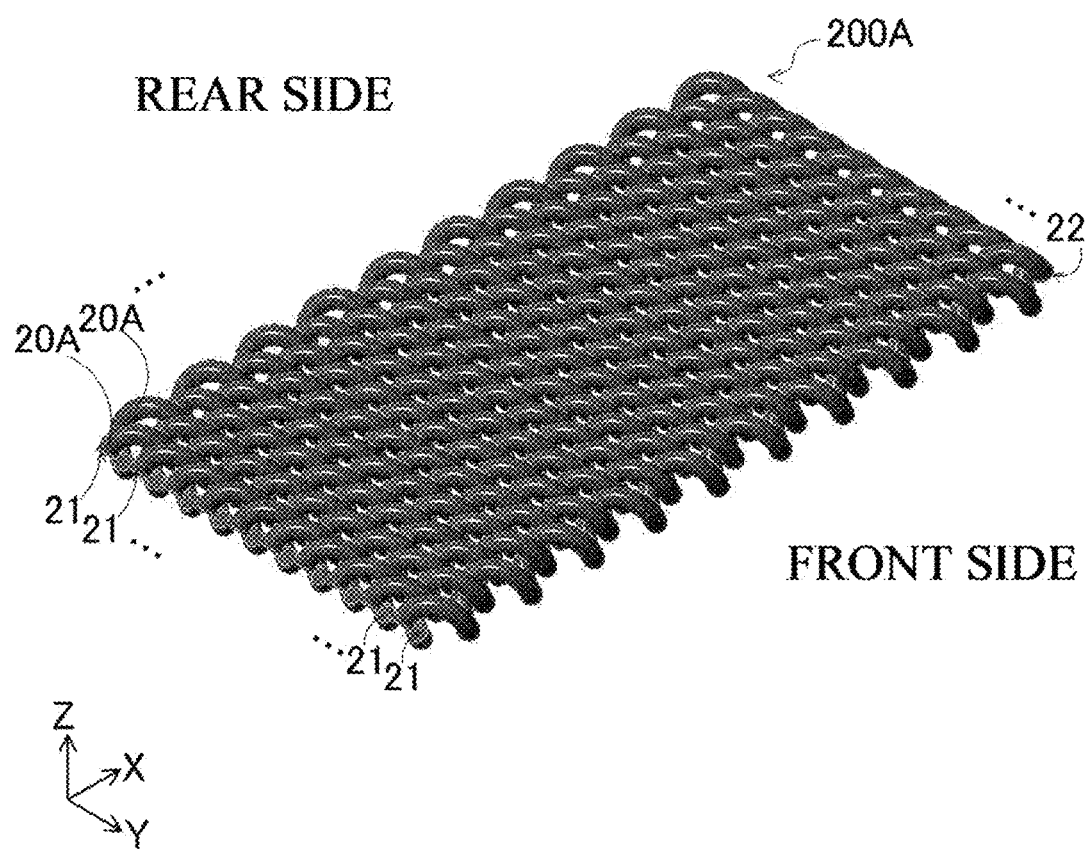
FIG. 3 is a perspective view of a circular pipe array included in the heat sink according to Embodiment 1 of the present disclosure.
Figure 4A:
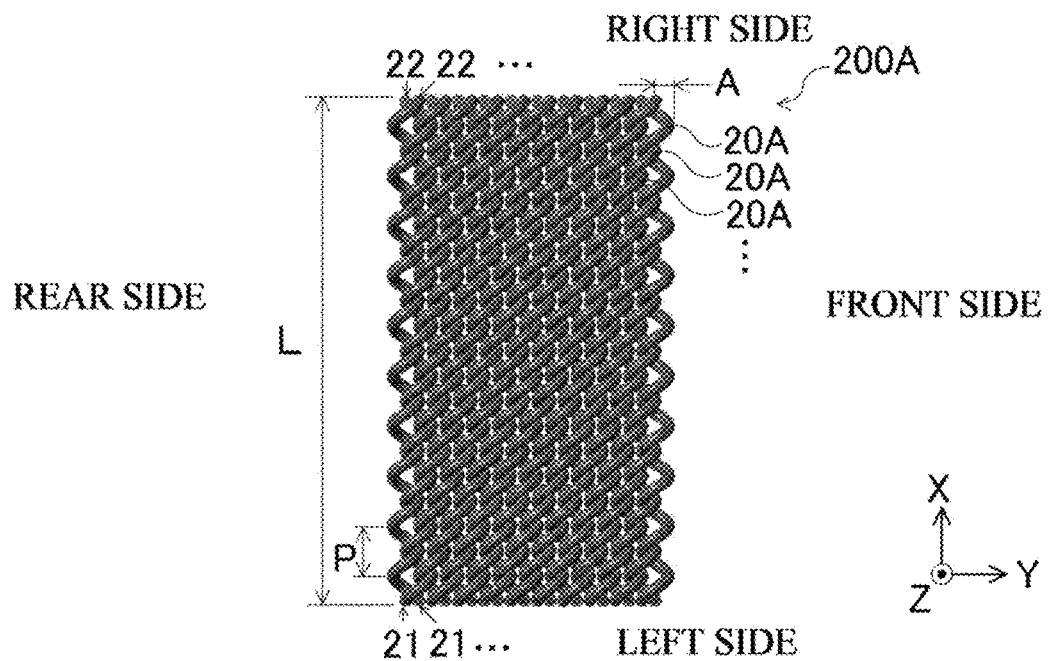
FIG. 4A is a top view of the circular pipe array included in the heat sink according to Embodiment 1 of the present disclosure.
Figure 4B:
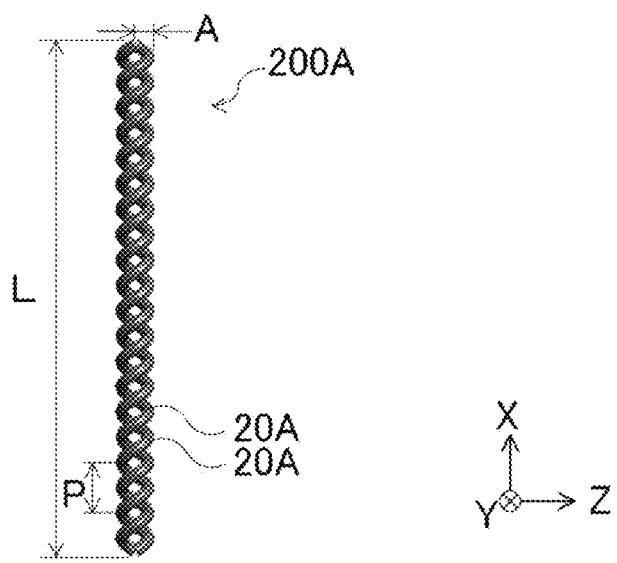
FIG. 4B is a rear view of the circular pipe array included in the heat sink according to Embodiment 1 of the present disclosure.
Figure 4C:
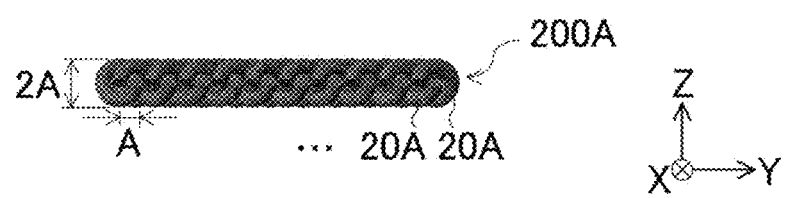
FIG. 4C is a left-side view of the circular pipe array included in the heat sink according to Embodiment 1 of the present disclosure.
Figure 5A:
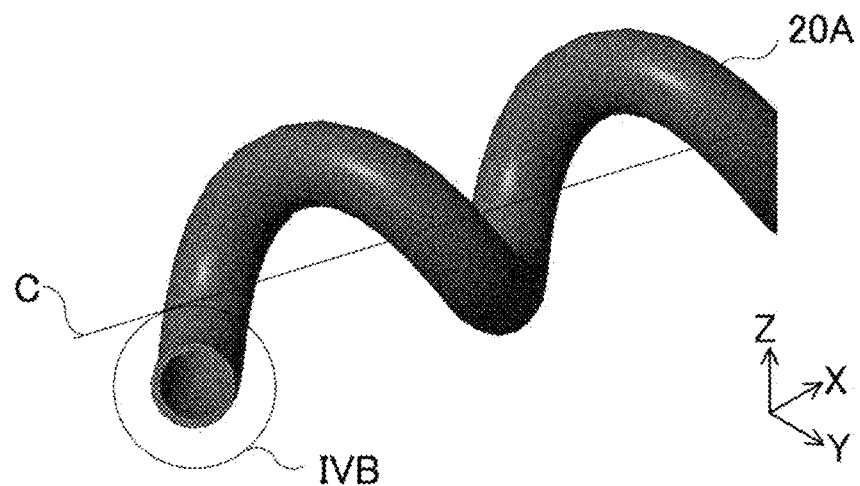
FIG. 5A is a perspective view of a circular pipe, which is extracted from the circular pipe array included in the heat sink according to Embodiment 1 of the present disclosure.
Figure 5B:
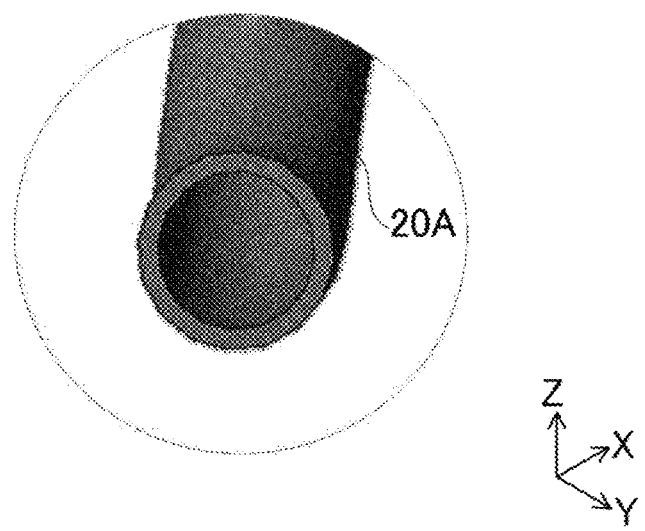
FIG. 5B is an enlarged view of the left end of the circular pipe, which is extracted from the circular pipe array included in the heat sink according to Embodiment 1 of the present disclosure.
Figure 6A:
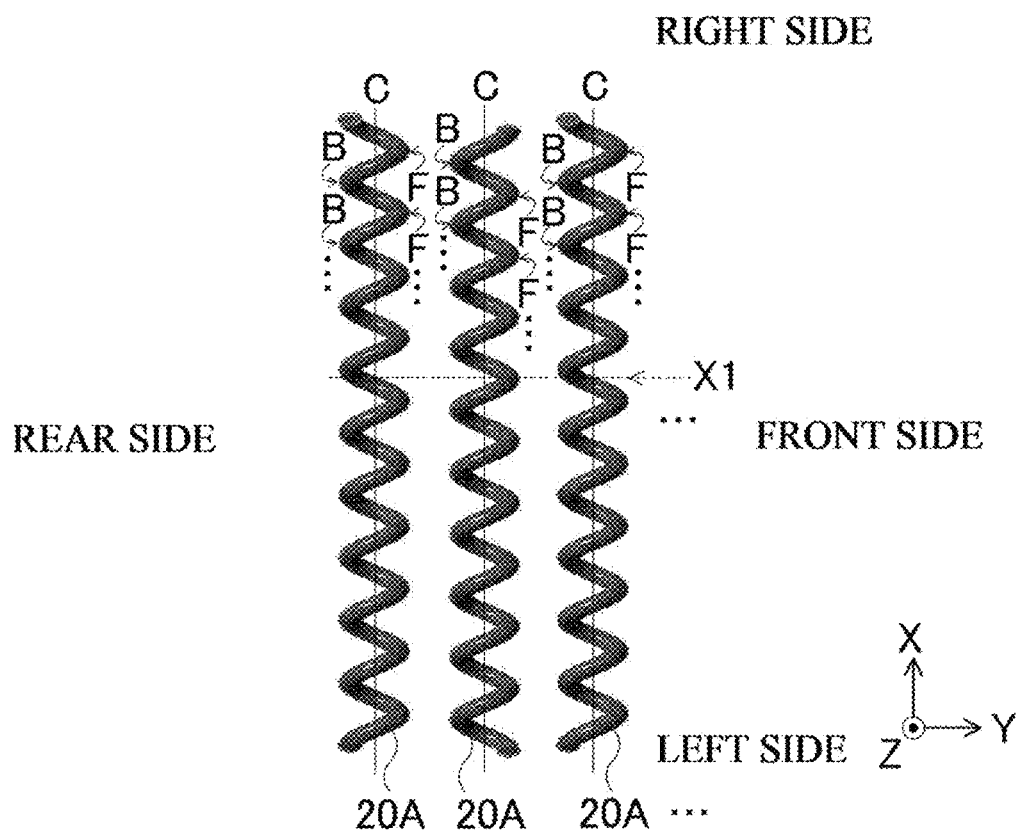
FIG. 6A is a top view of circular pipes, which are extracted from the circular pipe array included in the heat sink according to Embodiment 1 of the present disclosure and arranged in the same order as in the heat sink.
Figure 6B:
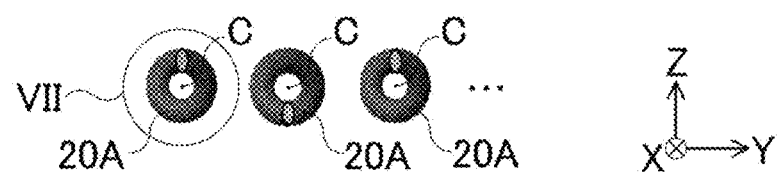
FIG. 6B is a left-side view of the circular pipes, which are extracted from the circular pipe array included in the heat sink according to Embodiment 1 of the present disclosure and arranged in the same order as in the heat sink.
Figure 7:
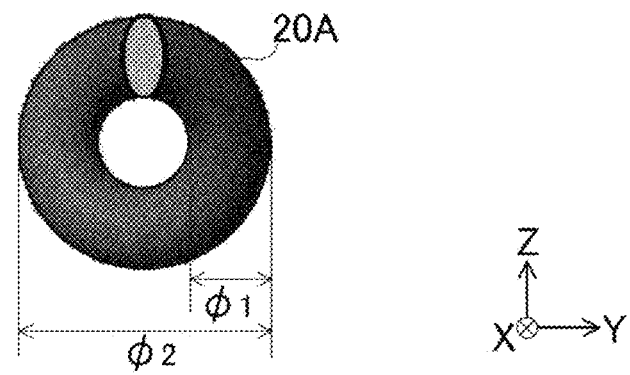
FIG. 7 is an enlarged view of the left end of the circular pipe in the region VII of FIG. 6B.

FIG. 3 is a perspective view of the circular pipe array 200A included in the heat sink 1A. FIGS. 4A to 4C are top, rear, and left-side views of the circular pipe array 200A. FIG. 5A is a perspective view of a circular pipe 20A, which is extracted from the circular pipe array 200A. FIG. 5B is an enlarged view of the left end of the circular pipe 20A. FIGS. 6A and 6B are top and left-side views of the circular pipes 20A arranged in the same order as in the heat sink 1A. FIG. 7 is an enlarged view of the left end of the circular pipe 20A in the region VII of FIG. 6B. FIGS. 5A and 5B illustrate the circular pipe 20A when the circular pipe 20A illustrated in FIGS. 6A and 6B cut in the middle in order to facilitate an understanding of the internal structure of the circular pipe 20A.

As illustrated in FIGS. 3 and 4A to 4C, the circular pipe array 200A is made of the circular pipes 20A having a circular pipe section and intertwined with one another.

Each of the circular pipes 20A is made of a metal material having a high thermal conductivity, like the main body 10A, so as to readily receive the heat of the main body 10A. As illustrated in FIG. 5A, the circular pipe 20A extends in the left-right direction, that is, the X direction while winding in a helical shape. In other words, the circular pipe 20A has a shape of a helix that curves in the clockwise direction around a central axis C toward the +X direction.

The clockwise direction indicates the clockwise direction when viewed from the −X side to the +X side. The helix indicates a three-dimensional curve that rotates around and shifts in the direction perpendicular to the plane of rotation. The concept of the helix includes a three-dimensional helix but excludes a two-dimensional spiral in this specification. The circular pipe 20A is an exemplary metal pipe in this specification.

As illustrated in FIG. 5B, each of the circular pipes 20A is a hollow pipe. In other words, the circular pipe 20A has an internal space surrounded by the pipe wall. The internal space of the circular pipe 20A is used to convey refrigerant and thus serves as a flow path.

Such circular pipes 20A are arranged in the front-rear direction, as illustrated in FIG. 3. The circular pipes 20A adjacent in the front-rear direction are intertwined with one another such that the phases of the above-mentioned helices are deviated from each other.

In detail, when the intertwined circular pipes 20A illustrated in FIG. 3 are loosened and arranged in the original order in the front-rear direction, that is, the Y direction, the phases of the adjacent circular pipes 20A are found to be deviated from each other by almost 180°, as illustrated in FIGS. 6A and 6B. That is, when the adjacent circular pipes 20A are cut at a certain X position by a plane parallel to the YZ plane, the positions of the adjacent circular pipes 20A in this plane relative to the central axis C are deviated from each other by almost 180°. For example, the position indicated by the arrow X1 in FIG. 6A of a first circular pipe 20A arranged closest to the −Y end is located on the −Y side of the central axis C. In contrast, the corresponding position of a second circular pipe 20A adjacent to and arranged on the +Y side of the first circular pipe 20A is located on the +Y side of the central axis C. This fact means that the phases of the circular pipes 20A adjacent in the Y direction are deviated from each other by almost 180°.

As illustrated in FIG. 7, the circular pipes 20A are each shaped so as to satisfy Expression 1-1 below:

$$3\varphi_1 \leq \varphi_2 \qquad \text{(Expression 1-1)}$$

where $\varphi_1$ indicates the outer diameter of the circular pipe 20A itself, and $\varphi_2$ indicates the outer diameter of the helix defined by the circular pipe 20A.

Because of this shape of the circular pipe 20A, the circular pipe 20A can be intertwined with another circular pipe 20A adjacent in the Y direction. The circular pipes 20A are intertwined with one another but hardly interfere each other. As illustrated in FIGS. 4A and 4B, the circular pipes 20A are intertwined with one another in the Y direction every one cycle of the helix.

In detail, the circular pipes 20A are arranged such that their central axes C are parallel to one another, although this structure is not illustrated. The central axes C are away from each other with an interval equal to the difference of the outer diameter $\varphi_1$ of the circular pipe 20A from the outer diameter $\varphi_2$ of the helix illustrated in FIG. 7. As illustrated in FIG. 6A, a front-end portion F, which protrudes to the most anterior position, of a first circular pipe 20A is twined from the front side with a back-end portion B, which protrudes to the most posterior position, of a second circular pipe 20A adjacent to and arranged on the front side of the first circular pipe 20A. A back-end portion B of the first circular pipe 20A is twined from the rear side with the front-end portion F of a third circular pipe 20A adjacent to and arranged on the rear side of the first circular pipe 20A. The circular pipes 20A are thus intertwined with one another every one cycle of the helix. The circular pipes 20A therefore configure the net-like circular pipe array 200A, as illustrated in FIGS. 4A to 4C.

The left and right ends of the circular pipes 20A are open, as illustrated in FIGS. 3 and 4A. The left and right ends are coupled to an external apparatus, which is not illustrated, and thus serve as supply ports 21 to be fed with refrigerant and discharge ports 22 to discharge the refrigerant, respectively. The circular pipes 20A therefore function as flow paths that convey the refrigerant.

The circular pipes 20A extend in the left-right direction, as illustrated in FIGS. 3, 4A, and 4B. The circular pipes 20A thus guide the above-mentioned refrigerant from the supply ports 21 to the discharge ports 22. In addition, the circular pipes 20A are intertwined with one another in the front-rear direction, as described above. This structure increases the density of the circular pipes 20A as viewed from the top of the main body 10A, that is, the concentration of the flow paths. The configuration can therefore improve the efficiency of heat release of the circular pipes 20A from the main body 10A to the refrigerant.

As illustrated in FIGS. 4A to 4C and 7, assuming that (pi indicates the outer diameter of each of the circular pipes 20A, L indicates the length of the central axis of the above-mentioned helix, P indicates the pitch of the helix, and A indicates the amplitude of the helix, the circular pipe 20A preferably satisfies Expressions 2-1 and 2-2 below:

$$P = 4\varphi_1(\sigma+1) \quad \text{(Expression 2-1)}$$

$$A = \varphi_1(\sigma+1) \quad \text{(Expression 2-2)}$$

where σ is a distance factor representing a level of the minimum distance between circular pipes 20A of which the central axes of the helices are adjacent and satisfies the expression σ<1, and t is an intervening variable and satisfies the expression 0≤t≤1.

Furthermore, assuming that (i) the central axes of the helices extend in the X direction and adjacent in the Y direction and (ii) the X direction and the Y direction are orthogonal to the Z direction, the trajectory of the center of the nth circular pipe 20A in the Y direction preferably satisfies Expressions 2-3, 2-4, and 2-5 below on the basis of the circular measure:

$$X = tL \quad \text{(Expression 2-3)}$$

$$Y = A \cos\{360tL/P + 180(n-1)\} + A(n-1) \quad \text{(Expression 2-4)}$$

$$Z = A \sin\{360tL/P + 180(n-1)\} \quad \text{(Expression 2-5)}$$

In the case where the circular pipes 20A satisfy Expressions 2-1, 2-2, 2-3, 2-4, and 2-5, the circular pipes 20A are intertwined with one another, such that imaginary circular pipes 20A having a helix shape, of which the outer diameter is (σ+1) times large as the outer diameter of the circular pipes 20A, do not overlap each other and are in contact with each other. In other words, the circular pipes 20A are intertwined with one another in the closest manner such that the minimum distance, that is, interval between the adjacent circular pipes 20A is (pia. This structure allows the circular pipes 20A to define the densest flow paths and thus increase the area of heat release of the main body 10A per unit volume. The heat sink 1A therefore has improved heat release performance. Accordingly, the circular pipes 20A preferably satisfy Expressions 2-1, 2-2, 2-3, 2-4, and 2-5, as described above.

The above-mentioned interval (pia is preferably determined depending on various conditions, such as the material constituting the main body 10A, the minimum thickness defined by the manufacturing method, and a level of heat diffusion in the main body 10A.

Functions of the heat sink 1A are described below with reference to FIG. 8. The following description assumes that the heat emitter 2A, which is a power semiconductor device, is fed with electric power and emits heat. The description also assumes that the above-mentioned supply ports 21 are fed with water as the refrigerant from the external apparatus, which is not illustrated. This water is discharged from the discharge ports 22 and returns to this external apparatus, which is not illustrated.

Figure 8:
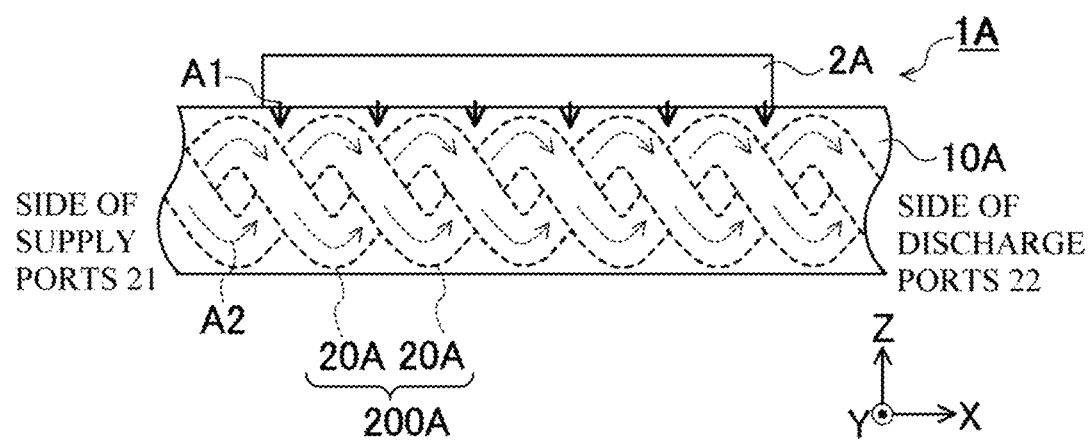
FIG. 8 is a conceptual diagram of the heat sink according to Embodiment 1 of the present disclosure while water is flowing in the heat sink.

FIG. 8 is a conceptual diagram of the heat sink 1A while water is flowing in the heat sink 1A.

When the heat emitter 2A emits heat, this heat is transferred to the main body 10A as represented by the arrows A1 in FIG. 8. The heat is transferred to the inside and the entire region of the main body 10A because of the metal material of the main body 10A having a high thermal conductivity.

The main body 10A includes the circular pipes 20A extending therein. The circular pipes 20A convey the above-mentioned water.

Since each of the circular pipes 20A has a helical shape winding in the up-down and front-rear directions, the water flows along a helical path, as represented by the arrows A2 in FIG. 8. The water thus receives centrifugal forces toward the radial directions of the helix. The centrifugal forces increase the flow rate of water in the vicinity of the inner wall of the circular pipe 20A in the radial directions of the helix.

This phenomenon reduces the thickness of a temperature boundary layer. The temperature boundary layer indicates a layer at which the temperature of the water significantly varies from the inner wall of the circular pipe 20A toward the center of the circular pipe 20A. Accordingly, the heat reaching the inner wall of the circular pipe 20A is readily transferred to the water, resulting in increased thermal conductivity from the main body 10A to the water.

The water flows through each of the circular pipes 20A having a helical shape. The inner wall of the circular pipe 20A has a contact area with the water larger than that of a linearly extending circular pipe. This configuration allows the water to absorb a larger amount of heat transferred from the heat emitter 2A to the main body 10A. In other words, the water absorbs a larger amount of heat because of the larger area of heat release from the inner wall of the circular pipe 20A. The heat transferred from the heat emitter 2A to the main body 10A is thus readily released to the water.

The multiple circular pipes 20A are arranged across the entire main body 10A in the front-rear direction and intertwined with one another. The circular pipes 20A are thus concentrated in the front-rear direction. The water flowing through the circular pipes 20A therefore absorbs heat from the entire main body 10A in the front-rear direction. The water also absorbs heat from the entire main body 10A in the left-right direction because the circular pipes 20A extend in the left-right direction. That is, the water absorbs heat transferred to the entire region of the main body 10A.

After absorbing heat from the main body 10A, the water is discharged from the above-mentioned discharge ports 22. The water thereby discharges the heat from the main body 10A to the outside, leading to cooling of the heat emitter 2A.

As described above, in the heat sink 1A, the main body 10A has a high thermal conductivity to the water and thus readily releases heat of the main body 10A to the water. Furthermore, the water absorbs heat of the entire main body 10A. The heat sink 1A therefore has improved heat release performance, that is, high capacity of cooling the heat emitter 2A.

A method of manufacturing the heat sink 1A is described below with reference to FIG. 9.

Figure 9:
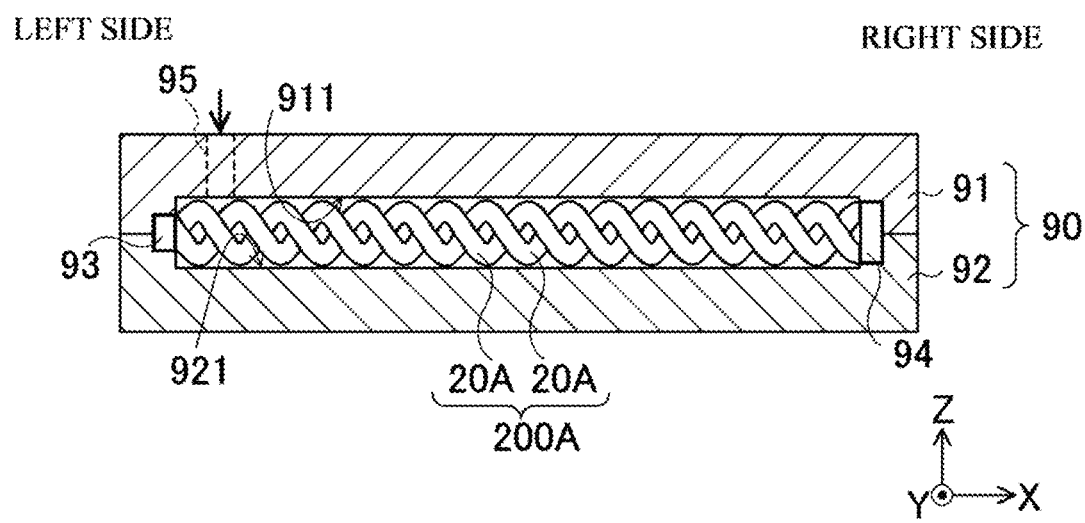
FIG. 9 is a conceptual diagram of a mold for inserting the net-like circular pipe array through casting in a method of manufacturing the heat sink according to Embodiment 1 of the present disclosure.

FIG. 9 is a conceptual diagram of a mold 90 for inserting the net-like circular pipe array 200A through casting in the method of manufacturing the heat sink 1A.

First, multiple circular pipes 20A are prepared having a helical shape illustrated in FIGS. 6A and 6B. The circular pipes 20A are made of a metal material having a melting point equal to or higher than that of the metal material of a below-described molten metal.

The prepared circular pipes 20A are then arranged in the above-described positional relationship. This process yields a net-like circular pipe array 200A illustrated in FIGS. 4A to 4C.

This step of preparing multiple circular pipes 20A and yielding a net-like circular pipe array 200A from the circular pipes 20A is an exemplary step of forming flow paths in this specification. This step is also called a flow path forming step in this specification.

The resulting net-like circular pipe array 200A is then placed in the mold 90, as illustrated in FIG. 9.

In detail, the mold 90 includes a plate 91 having a recess 911 on the lower surface, which has the upper bottom, and a plate 92 having a recess 921 on the upper surface, which has the lower bottom. The plate 91 can be stacked on the plate 92. While the plate 91 is stacked on the plate 92, the recesses 911 and 921 define a hollow having a shape of a rectangular parallelepiped like a plate and having dimensions identical to those of the above-described main body 10A.

The net-like circular pipe array 200A is introduced in the hollow defined by the recesses 911 and 921 by first placing the net-like circular pipe array 200A in the recess 921 of the plate 92 and then stacking the plate 91 on the plate 92. During the stacking of the plates 91 and 92, the openings of the circular pipes 20A included in the net-like circular pipe array 200A at the left and right ends are sealed with cores 93 and 94.

The hollow defined by the recesses 911 and 921 in the mold 90 is then filled with a molten metal, and this molten metal is allowed to fix.

In detail, a molten metal is prepared by melting the above-mentioned metal material, such as aluminum alloy or copper alloy, having a high thermal conductivity. The resulting molten metal is introduced through a pouring gate 95 into the mold 90. The hollow in the mold 90 is thus filled with the molten metal.

The metal material of this molten metal preferably has a melting point lower than that of the metal material constituting the circular pipes 20A, so as to avoid melting of the circular pipes 20A.

The mold 90 is then cooled and thereby allows the molten metal in the mold 90 to be fixed. The net-like circular pipe array 200A is thus inserted in the metal material of the molten metal through casting. This process yields a heat sink 1A including a main body 10A in which the net-like circular pipe array 200A extends.

The metal material constituting the molten metal is an exemplary first metal material in this specification. The metal material constituting the circular pipes 20A is an exemplary second metal material in this specification. The step of inserting the net-like circular pipe array 200A in the metal material through casting is an exemplary step of inserting multiple pipes in the first metal material through casting in this specification.

The plate 91 is then removed from the plate 92 in the mold 90, to extract the resulting heat sink 1A from the recess 921. The cores 93 and 94 are also removed from the openings of the circular pipes 20A at the left and right ends. A heat emitter 2A is then mounted on a plate surface of the main body 10A. This process completes the heat sink 1A capable of cooling the heat emitter 2A.

The above-described step of preparing multiple circular pipes 20A and yielding a net-like circular pipe array 200A from the circular pipes 20A may also be a step of forming the net-like circular pipe array 200A with an additive manufacturing device, more specifically, a 3D printer, for example, although this alternative step requires extra time.

Alternatively, the net-like circular pipe array 200A may be prepared by a lost-wax casting process, although this alternative step cannot readily achieve fabrication of a circular pipe 20A having a minute diameter.

As described above, the heat sink 1A according to Embodiment 1 includes the net-like circular pipe array 200A made of the circular pipes 20A having a helical shape and intertwined with one another. This structure allows refrigerant flowing in the circular pipes 20A to readily receive heat. The heat sink 1A therefore has an improved heat release efficiency.

In the circular pipes 20A, the central axes C of the helices are adjacent and parallel to one another. The adjacent circular pipes 20A are intertwined with one another every one cycle of the helix. Such dense arrangement of the circular pipes 20A increases the heat release efficiency of the heat sink 1A.

Embodiment 2

In the heat sink 1A according to Embodiment 1, the metal material constituting the main body 10A and the metal material constituting the circular pipes 20A have melting points identical to or different from each other. That is, the main body 10A and the circular pipes 20A in the heat sink 1A may be made of mutually different metal materials. In contrast, a heat sink 1B according to Embodiment 2 is characterized in that the metal material constituting a main body 10B differs from the metal material constituting circular pipes 20B. In order to avoid corrosion due to a combination of different metal materials, the circular pipes 20B are plated.

The heat sink 1B according to Embodiment 2 is described below with reference to FIGS. 10 and 11. The description of Embodiment 2 is mainly directed to the differences from Embodiment 1.

Figure 10:
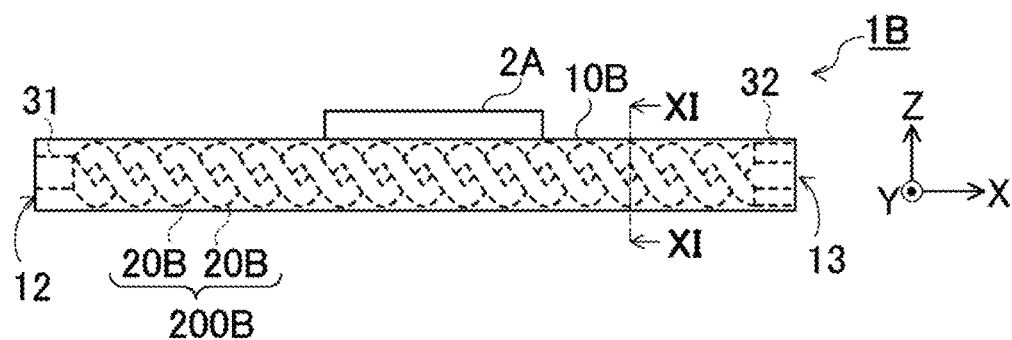
FIG. 10 is a rear view of a heat sink according to Embodiment 2 of the present disclosure.

FIG. 10 is a rear view of the heat sink 1B according to Embodiment 2. FIG. 11 is a sectional view taken along the line XI-XI of FIG. 10. In FIG. 11, only the circular pipes 20B are represented by hatching in order to facilitate an understanding. The dot lines represent the outer circumference OC and the inner circumference IC of the circular pipe 20B winding in a helical shape.

In the heat sink 1B, the main body 10B includes supply flow paths 31 and discharge flow paths 32, as illustrated in FIG. 10.

Each of the supply flow paths 31 extends from a left surface portion 12 toward the inside of the main body 10B and leads to the left end of the circular pipe 20B. The supply flow path 31 is coupled to the refrigerant pipe included in the external apparatus and thereby guides refrigerant fed from the refrigerant pipe to the circular pipe 20B.

Each of the discharge flow paths 32 extends from a right surface portion 13 toward the inside of the main body 10B and leads to the right end of the circular pipe 20B. The discharge flow path 32 is coupled to the refrigerant pipe included in the external apparatus and thereby discharges the refrigerant in the circular pipe 20B to the refrigerant pipe.

The main body 10B is made of an aluminum alloy. In contrast, the circular pipes 20B are made of an iron and steel material. Accordingly, when refrigerant is fed to the heat sink 1B, this refrigerant comes into contact with the aluminum alloy constituting the inner walls of the supply flow paths 31 and the discharge flow paths 32 included in the main body 10B, and also comes into contact with the iron and steel material constituting the inner walls of the circular pipes 20B. The aluminum contained in the aluminum alloy and the iron contained in the iron and steel material have significantly different ionization tendencies. This feature causes potential differences between the supply flow paths 31 and the inner walls of the circular pipes 20B, and between the discharge flow paths 32 and the inner walls of the circular pipes 20B, so that current flows therebetween. These current flows may result in corrosion in the supply flow paths 31, the discharge flow paths 32, and the inner walls of the circular pipes 20B.

Figure 11:
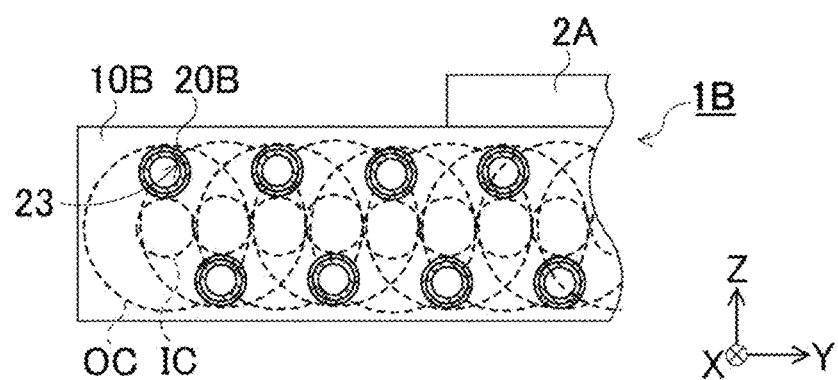
FIG. 11 is a sectional view taken along the line XI-XI of FIG. 10.

In order to solve this problem, the inner wall of each circular pipe 20B is plated, as illustrated in FIG. 11. In detail, the inner wall of the circular pipe 20B is covered with a coating layer 23.

The coating layer 23 is made of zinc. The zinc has an ionization tendency closer to that of the aluminum constituting the main body 10B than the iron constituting the circular pipe 20B. In detail, the iron constituting the circular pipe 20B has an ionization tendency higher than that of the aluminum constituting the main body 10B. The zinc constituting the coating layer 23 has an ionization tendency higher than that of the aluminum constituting the main body 10B and lower than that of the iron constituting the circular pipe 20B. The ionization tendency of the zinc constituting the coating layer 23 is therefore closer to that of the aluminum constituting the main body 10B than that of the iron constituting the circular pipe 20B. The coating layer 23 having this feature prevents corrosion by reducing the potential difference between the circular pipe 20B and the supply flow path 31 or the discharge flow path 32 in the main body 10B while the refrigerant is flowing.

The following description is directed to a method of manufacturing the heat sink 1B.

After preparation of the circular pipes 20B having a helical shape described in Embodiment 1, the inner walls of these circular pipes 20B are plated with zinc by a procedure, such as electroplating, hot-dip plating, or deposition plating. The plated circular pipes 20B are then intertwined with one another to yield a net-like circular pipe array 200B.

The zinc to be plated on the inner walls of the circular pipes 20B is an exemplary third metal material in this specification. The step of plating the inner walls of the circular pipes 20B with zinc is an exemplary step of plating the inner walls of pipes with the third metal material in this specification.

After preparation of the net-like circular pipe array 200B, this net-like circular pipe array 200B is inserted in an aluminum alloy through casting, as in Embodiment 1. This process produces the heat sink 1B including the main body 10B in which the net-like circular pipe array 200B extends.

A heat emitter 2A is then mounted on a plate surface of the main body 10B. This process completes the heat sink 1B capable of cooling the heat emitter 2A.

Although the above-mentioned coating layer 23 is made of zinc, the material constituting the coating layer 23 is only required to have an ionization tendency closer to that of the material constituting the main body 10B than that of the material constituting the circular pipe 20B. The coating layer 23 may thus be made of chromium, for example. In the case where the main body 10B is made of a copper alloy and the circular pipes 20B are made of an aluminum alloy, the coating layer 23 may be made of titanium.

Although the above-mentioned plating is applied to the inner walls of the circular pipes 20B, the plating may also be applied to the outer walls of the circular pipes 20B.

As described above, in the heat sink 1B according to Embodiment 2, the coating layer 23 is made of zinc having an ionization tendency closer to that of the aluminum constituting the main body 10B than the iron constituting the circular pipes 20B. The inner walls of the circular pipes 20B are covered with the coating layer 23. This configuration can make the heat sink 1B less susceptible to corrosion despite of the refrigerant flowing in the circular pipes 20B.

Embodiment 3

In the heat sinks 1A and 1B according to Embodiments 1 and 2, the inner walls of the circular pipes 20A and 20B have circular pipe sections and smooth surfaces. These heat sinks 1A and 1B are, however, mere examples. In a heat sink according to Embodiment 3, the inner wall of each of circular pipes 20C has protrusions 24.

The heat sink according to Embodiment 3 is described below with reference to FIGS. 12A, 12B, 13A, and 13B. The description of Embodiment 3 is mainly directed to the differences from Embodiments 1 and 2.

Figure 12A:
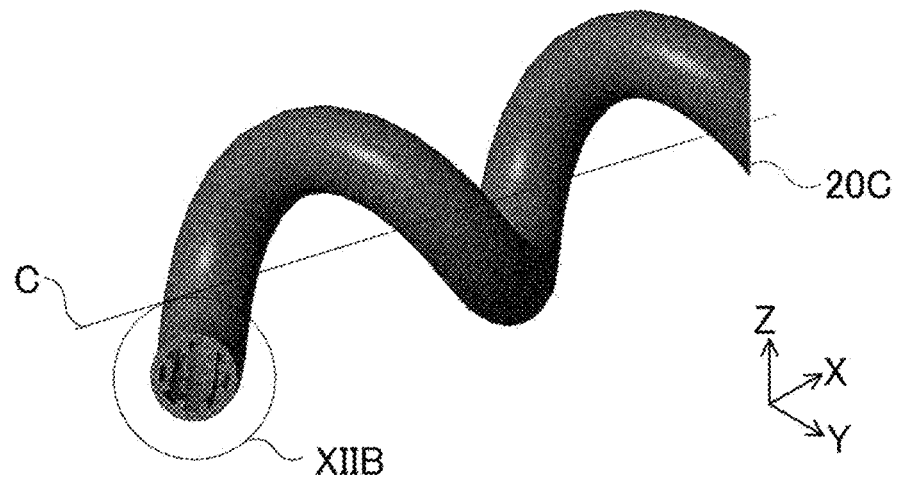
FIG. 12A is a perspective view of a circular pipe included in a heat sink according to Embodiment 3 of the present disclosure.
Figure 12B:
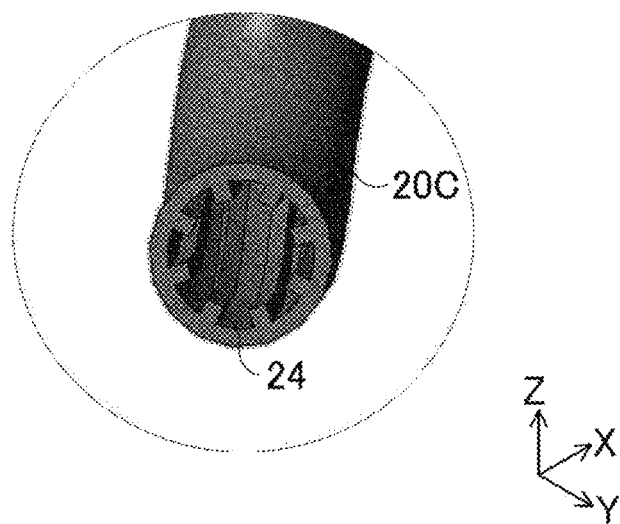
FIG. 12B is an enlarged view of the region XIIB of FIG. 12A.
Figure 13A:
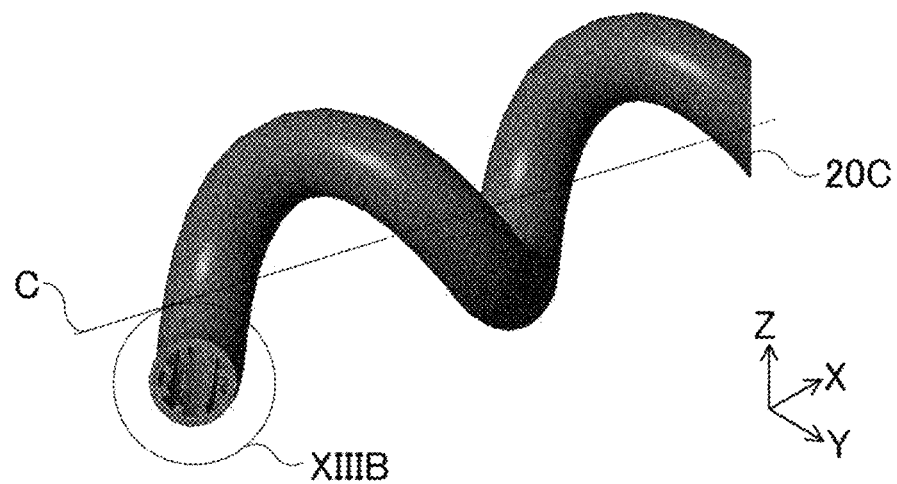
FIG. 13A is a perspective view of the circular pipe included in the heat sink according to a modification of Embodiment 3 of the present disclosure.
Figure 13B:
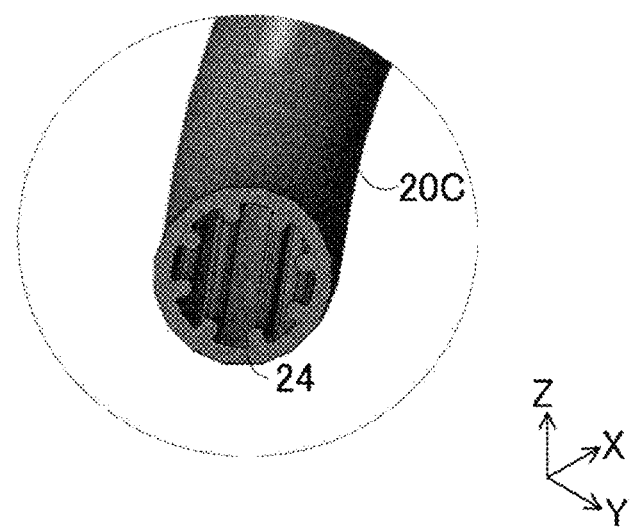
FIG. 13B is an enlarged view of the region XIIIB of FIG. 13A.

FIG. 12A is a perspective view of the circular pipe 20C included in the heat sink according to Embodiment 3. FIG. 12B is an enlarged view of the region XIIB of FIG. 12A. FIG. 13A is a perspective view of the circular pipe 20C according to a modification. FIG. 13B is an enlarged view of the region XIIIB of FIG. 13A. These figures illustrate the circular pipe 20C when the circular pipe 20C included in the heat sink is cut in the middle in order to facilitate an understanding.

As illustrated in FIGS. 12A and 12B, the inner wall of the circular pipe 20C has the rectangular protrusions 24 of which the longitudinal directions are aligned in the radial directions of the circular pipe in the sectional view.

The protrusions 24 extend in the direction in which the circular pipe 20C extends while maintaining the above-mentioned sectional shape. The circular pipe 20C extends in a helical shape like the circular pipes 20A and 20B described in Embodiments 1 and 2. The protrusions 24 thus has a helical shape, although this configuration is not illustrated.

The protrusions 24 extend in the direction in which the circular pipe 20C extends, as described above. The protrusions 24 thus extend in the direction in which refrigerant flows through the circular pipe 20C when the refrigerant is fed to the circular pipe 20C. The protrusions 24 thus disturb a flow of the refrigerant in the circumferential direction in the circular pipe 20C and stir the refrigerant. The protrusions 24 therefore improve the heat release performance of the circular pipe 20C. Furthermore, the protrusions 24 expand the surface area of the inner wall of the circular pipe 20C and thereby improve the heat release performance of the circular pipe 20C.

Each of the protrusions 24 has sharp corners having a rectangular shape in the sectional view. In detail, the corners of the distal end of the protrusion 24 located adjacent to the pipe center are not rounded and have the right angle in the sectional view. The protrusion 24 thereby inhibits development of the temperature boundary layer mentioned in Embodiment 1. The protrusion 24 therefore allows the heat transferred to the inner wall of the circular pipe 20C to be readily transferred to the refrigerant.

A method of manufacturing the heat sink according to Embodiment 3 is identical to the methods according to the above embodiments except for that the method involves providing the protrusions 24 in the circular pipe 20C. The method of manufacturing the heat sink is thus not redundantly described in Embodiment 3.

The above-mentioned corners of the protrusion 24 may also be rounded, as illustrated in FIGS. 13A and 13B. In detail, the corners of the protrusion 24 may be processed to have a rounded edge and define a curved outline in the sectional view. In this case, the protrusion 24 can inhibit generation of a vortex near the corners while the refrigerant is flowing through the circular pipe 20C. The protrusion 24 can therefore reduce the pressure loss of the refrigerant.

The protrusions 24 may also extend in the direction perpendicular to the central axis C of the helix provided that the protrusions 24 can stir the refrigerant. Alternatively, the protrusions 24 may extend in the direction in which the circular pipe 20C extends while meandering in the circumferential direction of the inner wall of the circular pipe 20C.

As described above, in the heat sink according to Embodiment 3, the protrusions 24 provided in the circular pipe 20C stir refrigerant while the refrigerant is flowing through the circular pipe 20C. This structure improves the heat release performance of the circular pipe 20C. The heat sink therefore has an improved heat release efficiency.

Embodiment 4

In the heat sinks 1A and 1B according to Embodiments 1 and 2, the left and right ends of the circular pipes 20A and 20B are open at the left surface portion 12 and the right surface portion 13 of the main bodies 10A and 10B and serve as the supply ports 21 and the discharge ports 22 for the refrigerant, respectively. These heat sinks 1A and 1B are, however, mere examples. The heat sinks 1A and 1B may be provided with headers for distributing and collecting the refrigerant. A heat sink 1D according to Embodiment 4 includes headers.

The heat sink 1D according to Embodiment 4 is described below with reference to FIG. 14. The description of Embodiment 4 is mainly directed to the differences from Embodiments 1 to 3.

Figure 14:
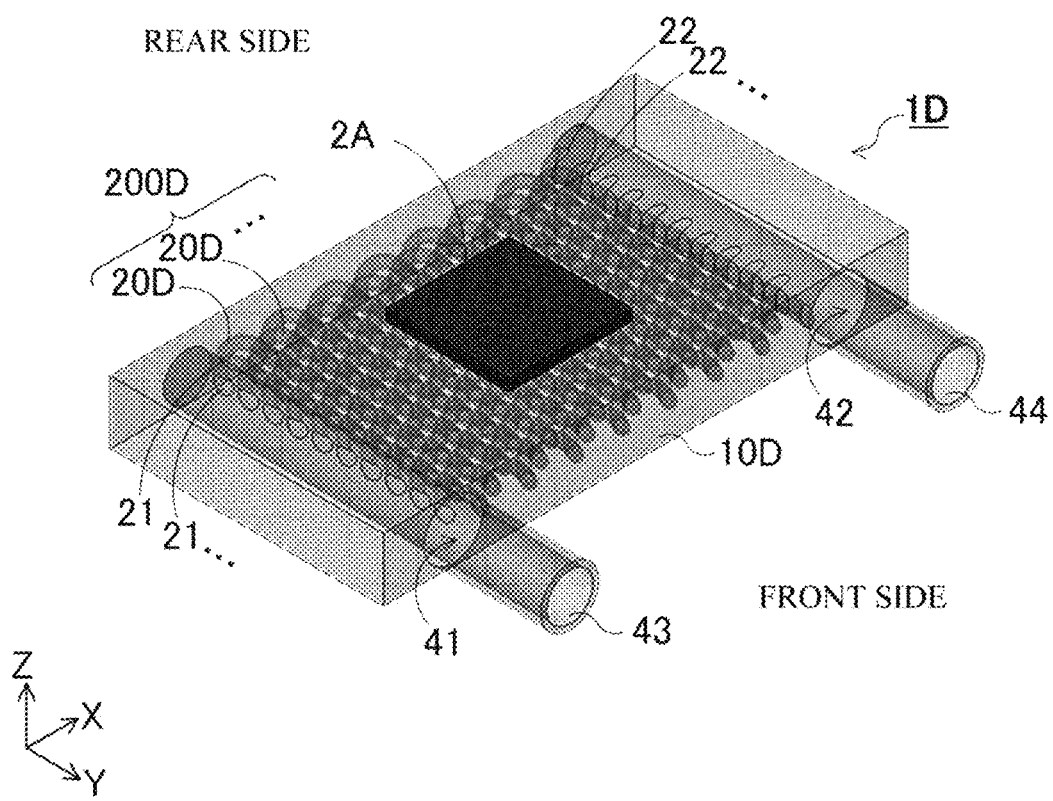
FIG. 14 is a perspective view of a heat sink according to Embodiment 4 of the present disclosure.

FIG. 14 is a perspective view of the heat sink 1D according to Embodiment 4. FIG. 14 illustrates a main body 10D in translucent gray so as to expose a circular pipe array 200D therein in order to facilitate an understanding.

As illustrated in FIG. 14, the heat sink 1D includes an inlet header 41 that connects the supply ports 21 included in the respective circular pipes 20D to each other, and an outlet header 42 that connects the discharge ports 22 included in the respective circular pipes 20D to each other.

The inlet header 41 has a hollow cylindrical shape and extends through the main body 10D in the front-rear direction. The rear end of the inlet header 41 is sealed, although this configuration is not illustrated. The front end of the inlet header 41 is provided with an inlet pipe 43 by press fitting. The inlet pipe 43 is connected to the external apparatus and feeds refrigerant.

The shaft of the cylinder defined by the inlet header 41 is orthogonal to the shafts of the cylinders defined by the circular pipes 20D. The inner periphery of the inlet header 41 has openings leading to the supply ports 21 included in the respective circular pipes 20D. That is, the space inside the inlet header 41 is in communication with the supply ports 21. The inlet header 41 having this structure distributes the refrigerant to the individual supply ports 21 of the circular pipes 20D when the refrigerant is fed from the inlet pipe 43.

The outlet header 42 also has a hollow cylindrical shape and extends through the main body 10D in the front-rear direction, like the inlet header 41. The rear end of the outlet header 42 is sealed, like that of the inlet header 41. The front end of the outlet header 42 is provided with an outlet pipe 44 by press fitting. The outlet pipe 44 is connected to the external apparatus and discharges the refrigerant.

The shaft of the cylinder defined by the outlet header 42 is orthogonal to the shafts of the cylinders defined by the circular pipes 20D. The inner periphery of the outlet header 42 has openings leading to the discharge ports 22 included in the respective circular pipes 20D. That is, the space inside the outlet header 42 is in communication with the discharge ports 22. The outlet header 42 having this structure collects the refrigerant discharged from the individual discharge ports 22 when the refrigerant flows through the circular pipes 20D.

The inlet header 41 is an exemplary first header in this specification. The outlet header 42 is an exemplary second header in this specification.

A method of manufacturing the heat sink 1D according to Embodiment 4 is identical to that in Embodiment 1, except for that: (1) the length in the left-right direction of the main body 10D is longer than that of the circular pipes 20D; (2) the inlet header 41 and the outlet header 42 are disposed in the vicinity of the left and right ends of the main body 10D, respectively; and (3) the inlet pipe 43 and the outlet pipe 44 are press-fitted to the inlet header 41 and the outlet header 42, respectively. The method of manufacturing the heat sink 1D is thus not redundantly described in Embodiment 4.

The inlet header 41 and the outlet header 42 may be fabricated using cores having hollow cylindrical shapes during insertion of the net-like circular pipe array 200D in the metal material through casting.

Although the inlet pipe 43 and the outlet pipe 44 are press-fitted to the inlet header 41 and the outlet header 42 in the heat sink 1D, the inlet pipe 43 and the outlet pipe 44 may be coupled to the inlet header 41 and the outlet header 42 by other means. For example, the inlet pipe 43 and the outlet pipe 44 may have male threads, and the inlet header 41 and the outlet header 42 may have female threads. The inlet pipe 43 and the outlet pipe 44 may be coupled to the inlet header 41 and the outlet header 42 by fitting the male threads of the inlet pipe 43 and the outlet pipe 44 into the female threads of the inlet header 41 and the outlet header 42, respectively.

As described above, the heat sink 1D according to Embodiment 4 includes the inlet header 41 and the outlet header 42 in the main body 10D and can therefore readily feed and discharge the refrigerant.

The inlet header 41 and the outlet header 42 are hollows formed in the main body 10D and are integrated with the main body 10D. The heat sink 1D thus has a simple structure.

Embodiment 5

In Embodiment 1, the heat sink 1A is fabricated by inserting the net-like circular pipe array 200A in the metal material through casting. This method of manufacturing the heat sink 1A is, however, a mere example. A heat sink 1E according to Embodiment 5 is manufactured by stacking plate-like members on each other.

The heat sink 1E according to Embodiment 5 is described below with reference to FIGS. 15 and 16. The description of Embodiment 5 is mainly directed to the differences from Embodiments 1 to 4.

Figure 15:
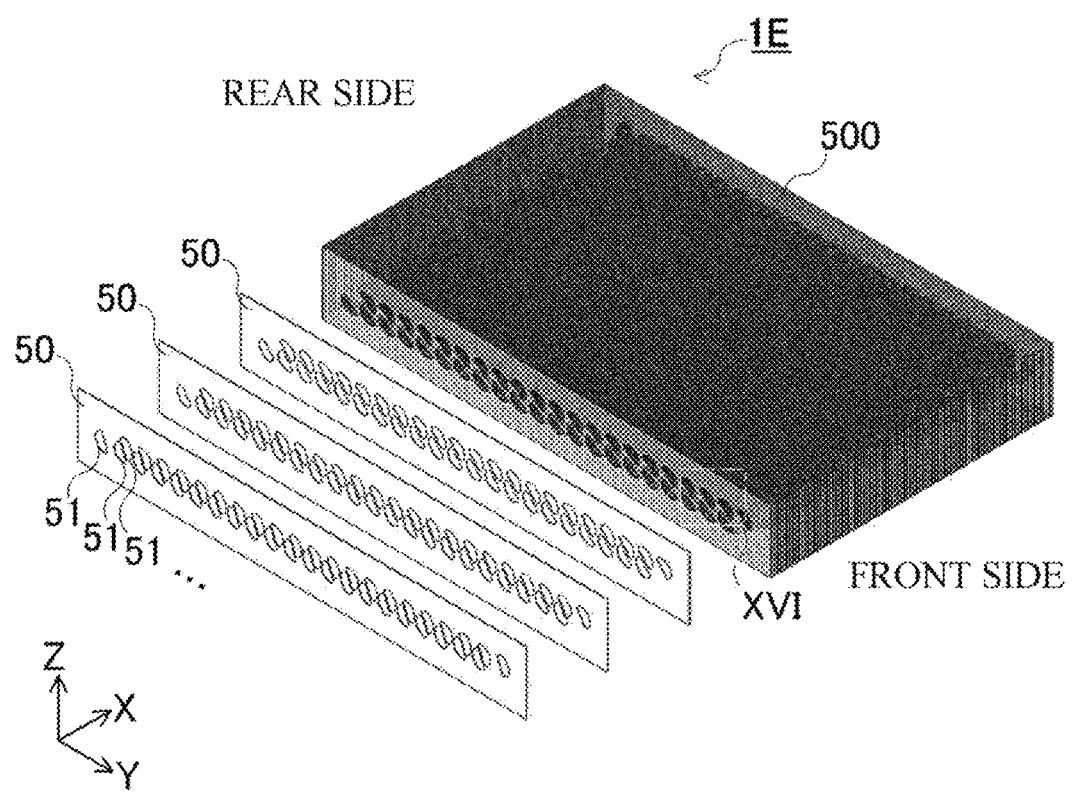
FIG. 15 illustrates a configuration of components of a heat sink according to Embodiment 5 of the present disclosure.
Figure 16:
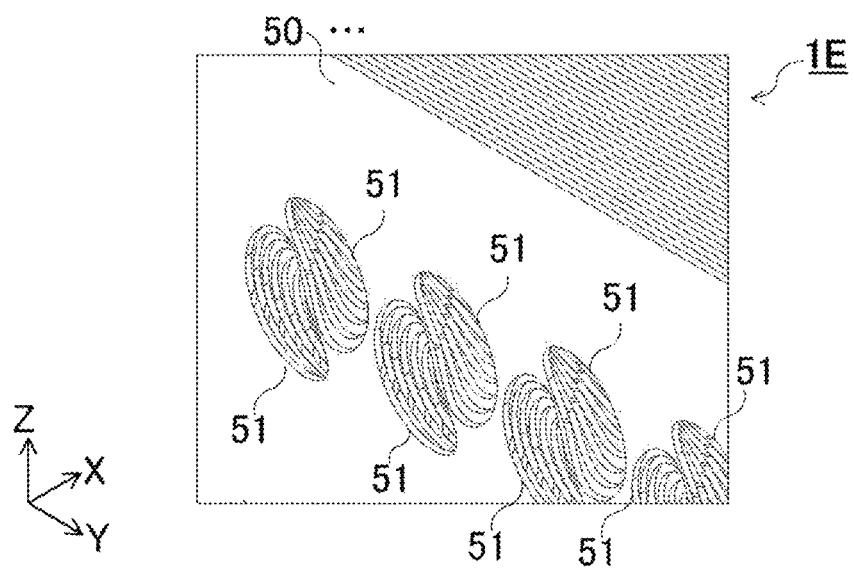
FIG. 16 is an enlarged view of the region XVI of FIG. 15.

FIG. 15 illustrates a configuration of the components of the heat sink 1E according to Embodiment 5. FIG. 16 is an enlarged view of the region XVI of FIG. 15. FIG. 15 illustrates the heat sink 1E when only some of multiple plate-like members 50 constituting the heat sink 1E are disassembled and extracted, in order to facilitate an understanding.

As illustrated in FIG. 15, the heat sink 1E is manufactured by stacking a large number of plate-like members 50 on each other.

The plate-like members 50 are made of a metal material, such as aluminum alloy or copper alloy, having a high thermal conductivity, like the main body 10A described in Embodiment 1. The plate-like members 50 each have a rectangular plate surface having the shape identical to that of the section of the main body 10A described in Embodiment 1 perpendicular to the left-right direction. The plate-like members 50 are disposed such that the longitudinal direction of the plate surfaces is aligned in the front-rear direction and the transverse direction is aligned in the up-down direction.

The plate-like member 50 has a thickness equal to the value calculated by dividing the length in the left-right direction of the main body 10A described in Embodiment 1 by a relatively large integral number. Such plate-like members 50 are stacked on each other in the left-right direction to configure a layered body 500. The layered body 500 made of the above-mentioned integral number of plate-like members 50 stacked on each other has the dimension in the left-right direction identical to that of the main body 10A in Embodiment 1. The plate-like members 50 have the shape identical to that of the section of the main body 10A perpendicular to the left-right direction, as described above. The layered body 500 made of the above-mentioned integral number of plate-like members 50 stacked on each other thus has the same contour as that of the main body 10A in Embodiment 1.

The plate-like members 50 are each provided with multiple through holes 51 on the plate surface, which define openings having flattened shapes.

The number of the through holes 51 is identical to the number of the circular pipes 20A described in Embodiment 1. The openings defined by the through holes 51 have flattened shapes. The through holes 51 extend through each of the plate-like members 50 in the direction perpendicular to the plate surface. The through holes 51 in one plate-like member 50 define openings of which orientations and positions are deviated from those of the through holes 51 in another plate-like member 50 adjacent to the one plate-like member 50 in the left-right direction.

The deviations of the orientations and positions of the openings are described in detail below. When the plate-like members 50 are stacked on each other in the left-right direction, the centers of the through holes 51 included in the adjacent plate-like members 50 are arranged at the positions that define the helix described in Embodiment 1. The positions of the through holes 51 are thus deviated from each other, as described above.

The transverse directions of the openings defined by the through holes 51 are directed toward the center of the helix. Since the centers of the through holes 51 included in the adjacent plate-like members 50 are arranged at the positions that define the above-described helix, the orientations of the openings defined by the through holes 51 are thus deviated from each other between the adjacent plate-like members 50.

The openings defined by the through holes 51 have orientations and positions deviated from each other, as described above. Accordingly, in the layered body 500 made of the plate-like members 50 stacked on each other in the left-right direction, the entire arrays of the through holes 51 define holes having a helical shape, like the circular pipes 20A described in Embodiment 1.

These holes having a helical shape are fed with refrigerant. The individual through holes 51 thus serve as flow paths for the refrigerant.

Each of the holes having a helical shape is defined by an array of the through holes 51 orthogonal to the plate surfaces of the plate-like members 50. This configuration has steps between the through holes 51. The hole having a helical shape thus has an uneven inner wall, and these steps stir the refrigerant while the refrigerant is flowing through the hole. This configuration improves the heat release performance of the hole having a helical shape. The heat sink 1E therefore has an improved heat release efficiency.

The following description is directed to a method of manufacturing the heat sink 1E according to Embodiment 5.

First, plate-like members 50 made of the above-mentioned material and having the above-mentioned shape are prepared. The plate-like members 50 are then provided with through holes 51 having the above-mentioned shape. The number of the through holes 51 is identical to the number of the circular pipes 20A described in Embodiment 1.

In the formation of the through holes 51, the positions and orientations of the through holes 51 are varied depending on where the plate-like member 50 is located in the above-mentioned layered body 500. The through holes 51 are preferably formed by a procedure, such as laser processing, etching, or cutting. Alternatively, the through holes 51 may be formed simultaneously with the plate-like member 50 by press working.

The through holes 51 may be made continuous to each other in the case where the portion between the through holes 51 has an insufficient strength due to the excessively short distance between the through holes 51.

The step of forming the above-described through holes 51 and fabricating the plate-like members 50 having the through holes 51 is an exemplary step of fabricating plate-like members in this specification.

The plate-like members 50 provided with the through holes 51 are stacked on each other and then bonded to each other. For example, the stacked plate-like members 50 are bonded to each other by a procedure, such as brazing, diffusion bonding, or swaging. This process yields the heat sink 1E in which multiple flow paths having a helical shape are intertwined with one another.

The step of stacking and bonding the plate-like members 50 on and to each other is an exemplary step of configuring a block in this specification. The layered body 500 fabricated by stacking the plate-like members 50 on each other is an exemplary block in this specification.

A heat emitter 2A is then mounted on a surface of the layered body 500 corresponding the end surfaces of the plate-like members 50, although this configuration is not illustrated. This process completes the heat sink 1E capable of cooling the heat emitter 2A.

Although the above-described through holes 51 extend in the direction perpendicular to the plate surfaces of the plate-like members 50, the through holes 51 may also extend in a direction diagonal to the plate surfaces of the plate-like members 50.

Although the above-described through holes 51 linearly extend in the thickness direction of the plate-like members 50, the through holes 51 may also extend while winding in the thickness direction. That is, the above-mentioned holes having a helical shape may have smooth inner walls without the above-mentioned steps between the adjacent plate-like members 50 in the layered body 500.

As described above, the heat sink 1E according to Embodiment 5 can be readily manufactured by just stacking the plate-like members 50 having the through holes 51 on each other.

For example, Embodiment 1, in which the flow paths of the heat sink 1A are defined by the net-like circular pipe array 200A, is not suitable for ready manufacturing of the flow paths having minute structures. In contrast, such flow paths having minute structures can be readily manufactured in Embodiment 5, in which the flow paths are defined by the through holes 51 provided in the plate-like members 50.

Embodiment 6

In Embodiments 1 to 5, the main bodies 10A, 10B, and 10D each have the flat upper surface portion 11. That is, the surface on which the heat emitter 2A is mounted is flat. These shapes of the main bodies 10A, 10B, and 10D are, however, mere examples. The main bodies 10A, 10B, and 10D may also have a surface adjusted to the shape of the heat emitter 2A to be mounted. A heat sink 1F according to Embodiment 6 includes a curved main body 10F.

The heat sink 1F according to Embodiment 6 is described below with reference to FIG. 17. The description of Embodiment 6 is mainly directed to the differences from Embodiments 1 to 5.

Figure 17:
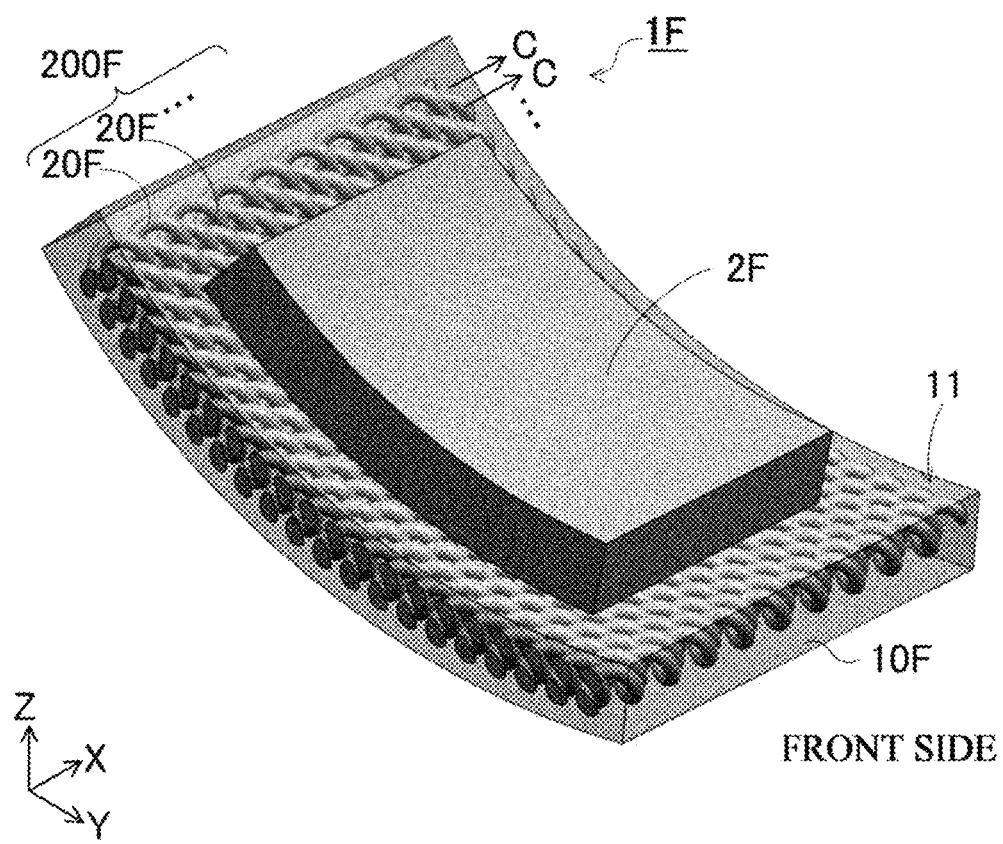
FIG. 17 is a perspective view of a heat sink according to Embodiment 6 of the present disclosure.

FIG. 17 is a perspective view of the heat sink 1F according to Embodiment 6. FIG. 17 illustrates the main body 10F in translucent gray so as to expose a circular pipe array 200F therein in order to facilitate an understanding.

As illustrated in FIG. 17, the heat sink 1F, which is configured to cool a heat emitter 2F having a shape of a plate curved in the longitudinal direction, that is, the front-rear direction, includes the main body 10F curved in the same direction.

The main body 10F has a shape of a plate larger than that of the heat emitter 2F and curved in the front-rear direction. The main body 10F includes the circular pipe array 200F therein, which is curved in the same direction as the main body 10F.

The circular pipe array 200F is made of a combination of multiple circular pipes 20F having the shape identical to that of the circular pipes 20A described in Embodiment 1. In the circular pipe array 200F, the circular pipes 20F are disposed such that the central axes C of the helices are aligned in the transverse direction of the plate surface of the main body 10F, that is, the X direction. These circular pipes 20F are adjacent to one another in the Y direction, and adjacent circular pipes 20F are intertwined with one another.

The mode of intertwining of the circular pipes 20F is identical to that in Embodiment 1, except for that adjacent circular pipes 20F are displaced from each other in the Z direction. In the circular pipe array 200F, with respect to the +Y direction from the circular pipe 20F at the −Y end to the center in the Y direction of the main body 10F, a second circular pipe 20F adjacent to and arranged on the +Y side of a first circular pipe 20F is displaced from the first circular pipe 20F in the −Z direction. With respect to the +Y direction from the center in the Y direction of the main body 10F to the circular pipe 20F at the +Y end, a fourth circular pipe 20F adjacent to and arranged on the +Y side of a third circular pipe 20F is displaced from the third circular pipe 20F in the +Z direction. The circular pipe array 200F thus has a shape of a net linearly extending in the X direction and curved in the Y direction. Accordingly, the circular pipe array 200F inside the main body 10F is curved along the upper surface portion 11 of the main body 10F on which the heat emitter 2F is mounted. This structure allows the heat from the heat emitter 2F to be effectively transferred to the circular pipe array 200F. The heat emitter 2F is therefore cooled at a high efficiency.

As described above, in the heat sink 1F according to Embodiment 6, the main body 10F has a surface curved along the shape of the heat emitter 2F to be mounted, and the circular pipe array 200F is curved along this surface. This structure allows the heat from the heat emitter 2F to be readily transferred to the main body 10F and to the circular pipe array 200F. The heat sink 1F therefore has an improved cooling capacity despite of the curved heat emitter 2F.

The upper surface portion 11 is curved. The upper surface portion 11 is an exemplary curved surface in this specification.

Modification

Although the main body 10F is curved because of the shape of a curved plate of the heat emitter 2F in Embodiment 6, the main body 10F may also be bent at an acute or obtuse angle.

Figure 18:
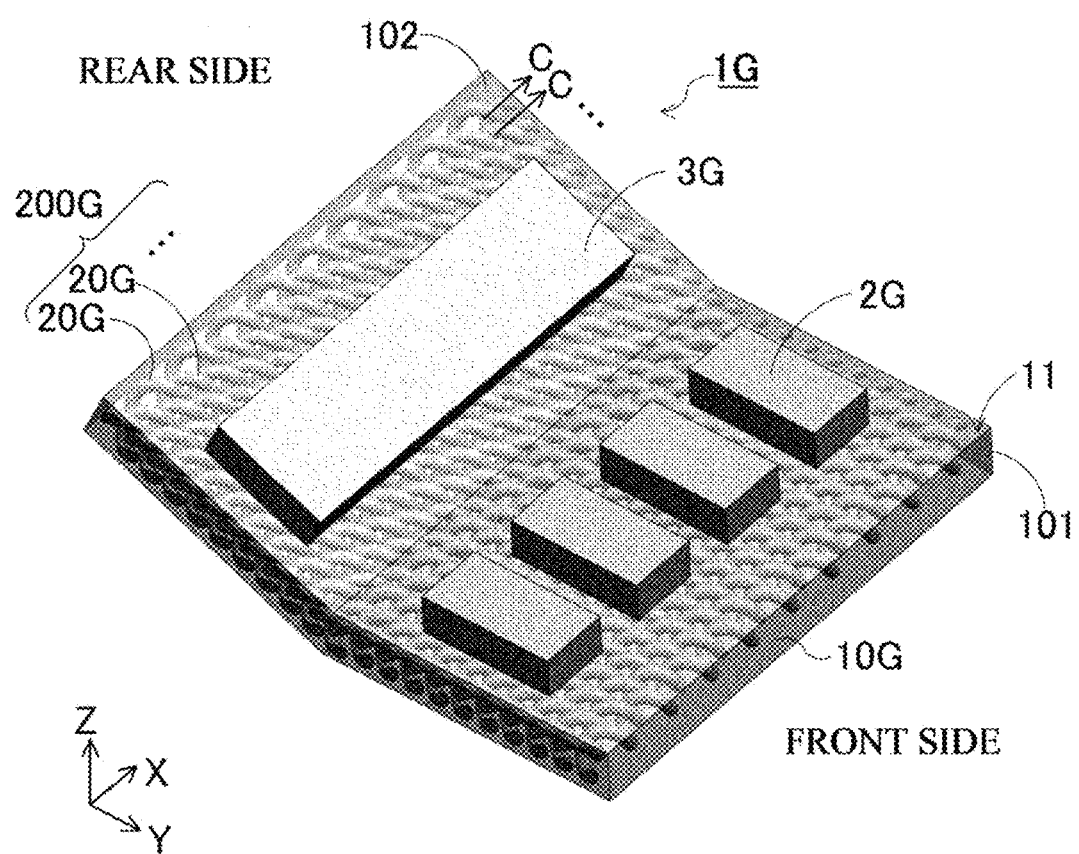
FIG. 18 is a perspective view of a heat sink according to a modification of Embodiment 6 of the present disclosure.

FIG. 18 is a perspective view of a heat sink 1G according to a modification of Embodiment 6. FIG. 18 illustrates a main body 10G in translucent gray so as to expose a circular pipe array 200G therein, like FIG. 17, in order to facilitate an understanding.

The heat sink 1G includes the main body 10G having a shape of a plate bent in the front-rear direction. In detail, the main body 10G includes a front plate 101 which has a rectangular shape like a plate and of which the transverse direction is aligned in the front-rear direction, and a rear plate 102 disposed on the rear side of the front plate 101 and adjoining the front plate 101. The transverse direction of the rear plate 102 is aligned in the direction rising toward the rear side. In other words, the transverse direction of the rear plate 102 forms an obtuse angle from the transverse direction of the front plate 101. The rear plate 102 is thus inclined from the front plate 101 at an obtuse angle.

The main body 10G includes the circular pipe array 200G therein, which is bent in the front-rear direction like the main body 10G. In detail, the circular pipe array 200G includes a front portion having a net-like shape along the plate surface of the front plate 101, and a rear portion having a net-like shape along the plate surface of the rear plate 102, which is inclined from the front portion at an obtuse angle. This bent shape is achieved because the circular pipe 20G at the +Y end of the rear portion is adjacent to and arranged on the −Y side and +Z side of the circular pipe 20G at the rear end of the front portion, that is, the −Y end of the front portion. The circular pipe array 200G having this shape uniformly receives the heat from the front plate 101 and the rear plate 102.

The main body 10G is provided with multiple heat emitters 2G and 3G to be cooled. In detail, multiple heat emitters 2G are mounted on the front plate 101, while a single heat emitter 3G is mounted on the rear plate 102. The front plate 101 and the rear plate 102 thus receive heat emitted from the heat emitters 2G and the heat emitter 3G. This heat received at the front plate 101 and the rear plate 102 is uniformly transferred to the circular pipe array 200G, as described above. Accordingly, cooling water flowing through the circular pipe array 200G cools the heat emitters 2G and 3G.

As described above, the heat sinks 1F and 1G may include the main bodies 10F and 10G bent at an acute or obtuse angle so as to allow the heat emitters 2G and 3G to be mounted.

Embodiment 7

In Embodiments 1 to 6, the heat emitters 2A, 2F, 2G, and 3G are mounted on only the upper surface portions 11 of the main bodies 10A, 10B, 10D, 10F, and 10G. These surfaces provided with the heat emitters 2A, 2F, 2G, and 3G are, however, mere examples. In a heat sink 1H according to Embodiment 7, heat emitters 2H are mounted on both plate surfaces of a main body 10H.

The heat sink 1H according to Embodiment 7 is described below with reference to FIGS. 19 and 20. The description of Embodiment 7 is mainly directed to the differences from Embodiments 1 to 6.

Figure 19:
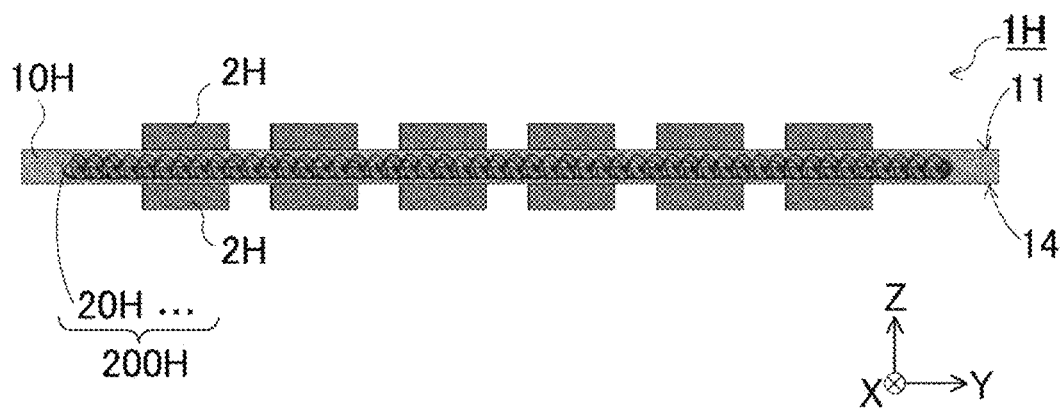
FIG. 19 is a left-side view of a heat sink according to Embodiment 7 of the present disclosure.

FIG. 19 is a left-side view of the heat sink 1H according to Embodiment 7. FIG. 20 is a perspective view of the heat sink 1H. FIGS. 19 and 20 illustrate the main body 10H in translucent gray so as to expose a circular pipe array 200H therein in order to facilitate an understanding.

Figure 20:
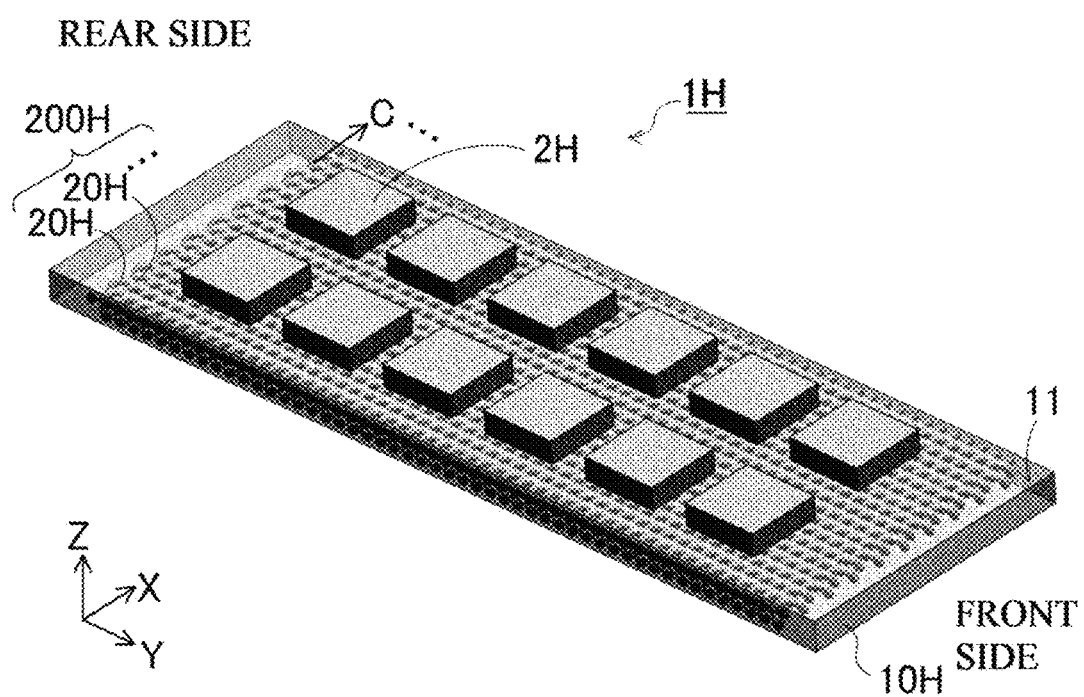
FIG. 20 is a perspective view of the heat sink according to Embodiment 7 of the present disclosure.

As illustrated in FIGS. 19 and 20, the heat sink 1H includes the main body 10H having a rectangular shape like a plate and having a plate surface facing upward, as in Embodiment 1. The main body 10H includes the circular pipe array 200H therein, as in Embodiment 1.

The circular pipe array 200H is disposed such that the central axes C of the helices are aligned in the transverse direction of the main body 10H, that is, the X direction, and includes multiple circular pipes 20H adjacent in the Y direction and are intertwined with one another. The circular pipe array 200H is disposed inside the main body 10H at a position equidistant from the upper surface portion 11 and a lower surface portion 14. The circular pipe array 200H thus uniformly receives the heat from the upper surface portion 11 and the lower surface portion 14.

The upper surface portion 11 and the lower surface portion 14 are each provided with multiple heat emitters 2H, as illustrated in FIG. 19. When the heat emitters 2H are activated and emit heat, the heat from the heat emitters 2H is transferred to the upper surface portion 11 and the lower surface portion 14. This heat is further transferred to the circular pipe array 200H. The heat is thus transferred to cooling water flowing through the circular pipe array 200H and thereby released. The cooling water in the circular pipe array 200H thus cools the heat emitters 2H.

As described above, in the heat sink 1H according to Embodiment 7, the heat emitters 2H are mounted on both of the upper surface portion 11 and the lower surface portion 14 of the main body 10H. The main body 10H includes the circular pipe array 200H extending therein and conveying the cooling water. The heat sink 1H can therefore simultaneously cool the heat emitters 2H on the upper surface portion 11 and the lower surface portion 14.

The upper surface portion 11 and the lower surface portion 14 are exemplary two opposed surfaces in this specification.

Embodiment 8

Although Embodiment 1 is directed to an example in which the circular pipe array 200A is fabricated with an additive manufacturing device in the flow path forming step involved in the method of manufacturing the heat sink 1A, this flow path forming step is a mere example. A method of manufacturing a heat sink according to Embodiment 8 involves a flow path forming step of intertwining the circular pipes 20A winding in a helical shape with each other using a jig 60, and thereby yielding the circular pipe array 200A.

The method of manufacturing the heat sink according to Embodiment 8 is described below with reference to FIGS. 21A to 21C, 22A to 22E, and 23A to 23D. The description of Embodiment 8 is mainly directed to the differences from Embodiments 1 to 7.

First, a configuration of the jig 60 used in the flow path forming step is described below with reference to FIGS. 21A to 21C.

Figure 21A:
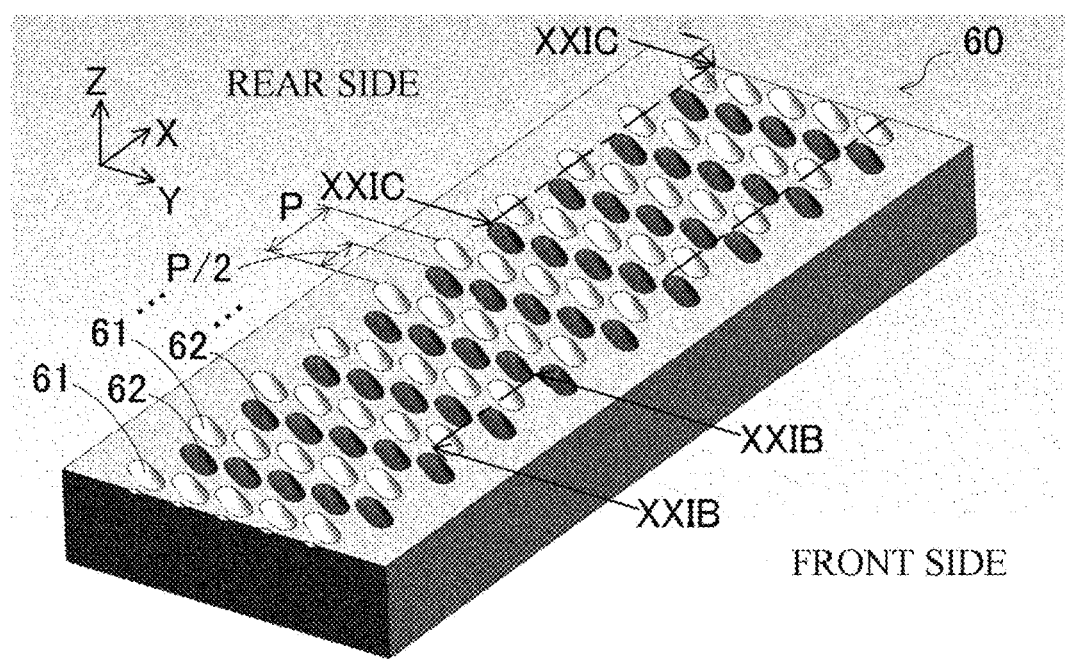
FIG. 21A is a perspective view of a jig used in a method of manufacturing a heat sink according to Embodiment 8.

FIG. 21A is a perspective view of the jig 60 used in the method of manufacturing the heat sink according to Embodiment 8. FIG. 21B is a perspective view of the jig 60 when the jig 60 is cut along the line XXIB-XXIB of FIG. 21A. FIG. 21C is a sectional view of the jig 60 taken along the line XXIC-XXIC of FIG. 21A. FIGS. 21A and 21B illustrate dimples 61 in white and dimples 62 in gray for discrimination between the dimples 61 and 62 formed on the jig 60.

Figure 21B:
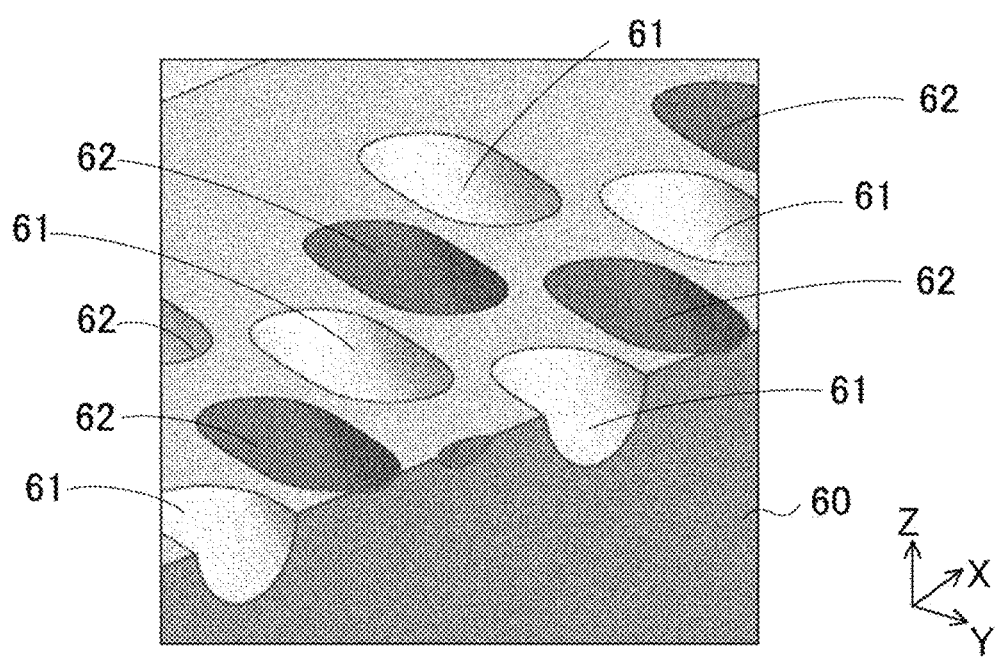
FIG. 21B is a perspective view of the jig when the jig is cut along the line XXIB-XXIB of FIG. 21A.

As illustrated in FIGS. 21A and 21B, the jig 60 has a plate shape. The upper surface of the jig 60 is provided with multiple dimples 61 aligned in the left-right direction at the pitch P of the helix mentioned in Embodiment 1, and multiple dimples 62 aligned in the left-right direction at the pitch P at the positions displaced from the array of the dimples 61 in the left-right direction by the half length of the pitch P. The array of the dimples 61 and the array of the dimples 62 are alternately arranged in the front-rear direction on the jig 60.

Figure 21C:
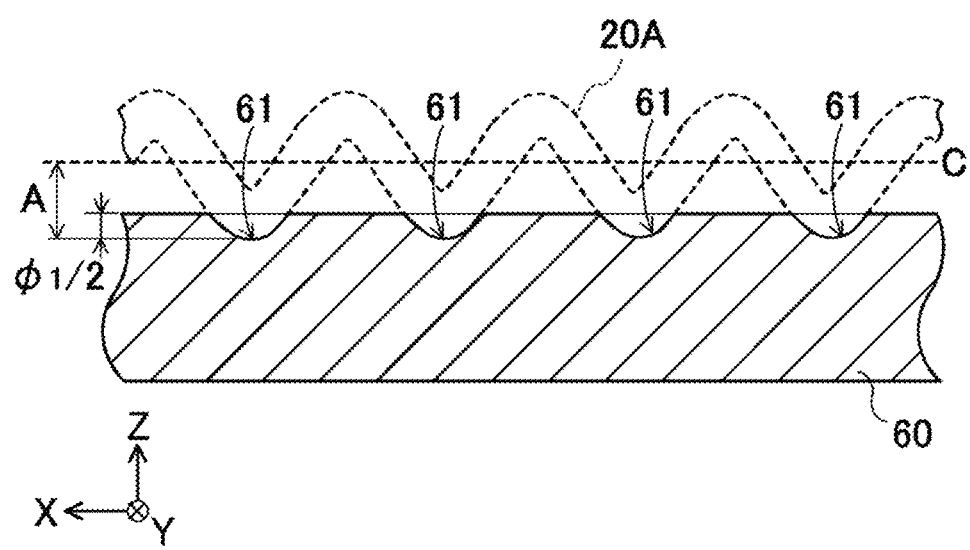
FIG. 21C is a sectional view of the jig taken along the line XXIC-XXIC of FIG. 21A.

As illustrated in FIG. 21C, the shapes and positions of the dimples 61 are adjusted to the contour of each circular pipe 20A, of which the central axis C of the helix is located at the height, which is calculated by subtracting the half length of the outer diameter $\varphi_1$ of the circular pipe 20A from the amplitude A of the helix mentioned in Embodiment 1, from the upper surface of the jig 60. In other words, the positions and shapes of the dimples 61 are determined such that the dimples 61 accommodate the respective lower portions of the circular pipe 20A at the above-mentioned position that are disposed below the upper surface of the jig 60. The circular pipe 20A fits in the dimples 61 and is thus retained by the dimples 61.

The number of the dimples 61 is determined such that the dimples 61 can accommodate the respective lower portions of an imaginary circular pipe 20A at the above-mentioned position that are disposed below the upper surface of the jig 60, assuming that the imaginary circular pipe 20A is twice as long as the real circular pipe 20A. The jig 60 can therefore retain the circular pipe 20A shifting in the left-right direction.

The shapes and positions of the dimples 62, which are not illustrated in FIG. 21C, are identical to those of the dimples 61, except for that: (1) the dimples 62 are displaced from the dimples 61 in the left-right direction by the half length of the pitch P; and (2) the dimples 62 are displaced from the dimples 61 in the front or rear direction by the interval between the central axes C mentioned in Embodiment 1. The number of the dimples 62 is determined as that of the dimples 61.

The dimples 61 and 62 having the above-mentioned shapes and arranged at the above-mentioned positions represent the shapes of the lower portions of the circular pipes 20A when the circular pipe array 200A is placed on the upper surface of the jig 60. Fitting the individual circular pipes 20A in the dimples 61 and 62 on the jig 60 can thus determine the positions of the circular pipes 20A in the circular pipe array 200A.

The description is then directed to the flow path forming step using the jig 60 with reference to FIGS. 22A to 22E and 23A to 23D. In the following description, among multiple circular pipes 20A to be intertwined with one another in the flow path forming step, a first circular pipe is provided with the reference symbol 20I, and a second circular pipe to be twined with the first circular pipe is provided with the reference symbol 20J, in order to facilitate an understanding. The resulting circular pipe array is provided with the reference symbol 200I.

Figure 22A:
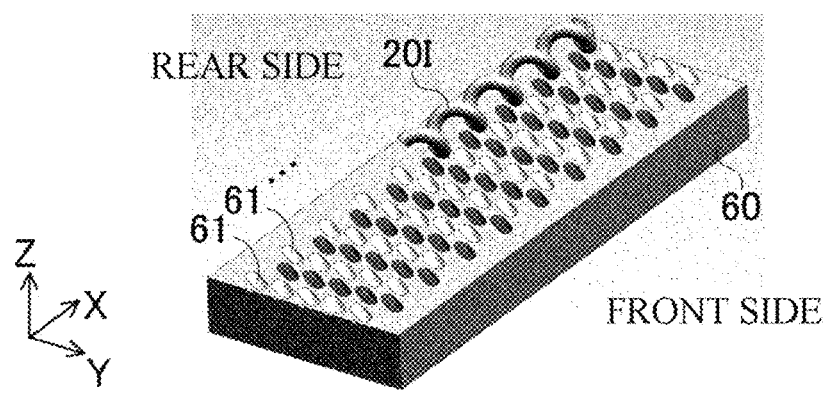
FIG. 22A is a perspective view of the jig used in the method of manufacturing the heat sink according to Embodiment 8 of the present disclosure when the jig retains a first circular pipe.
Figure 22B:
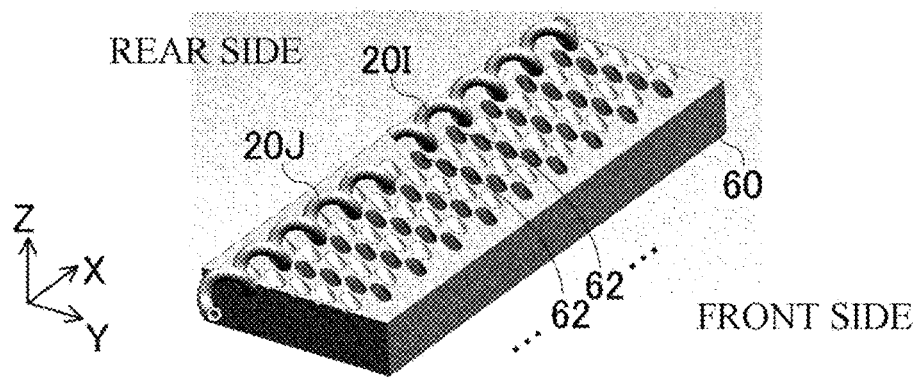
FIG. 22B is a perspective view of the jig used in the method of manufacturing the heat sink according to Embodiment 8 of the present disclosure when the jig retains a second circular pipe in addition to the first circular pipe.
Figure 23A:
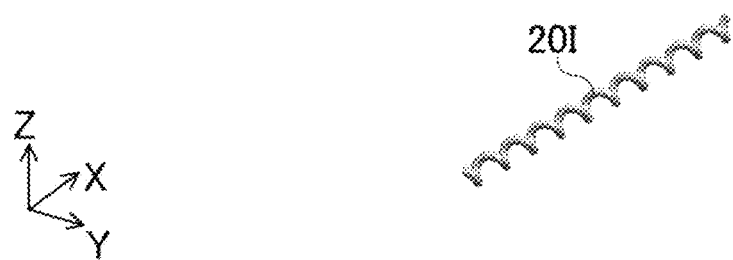
FIG. 23A is a perspective view of the first circular pipe to be retained on the jig in a flow path forming step involved in the method of manufacturing the heat sink according to Embodiment 8 of the present disclosure.

FIG. 22A is a perspective view of the jig 60 used in the method of manufacturing the heat sink according to Embodiment 8 when the jig 60 retains the first circular pipe 20I. FIG. 22B is a perspective view of the jig 60 when the jig 60 retains the second circular pipe 20J in addition to the first circular pipe 20I. FIG. 23A is a perspective view of the first circular pipe 20I to be retained on the jig 60 in this flow path forming step. FIGS. 23A to 23D illustrate only the first circular pipe 20I and the second circular pipe 20J without the jig 60, in order to facilitate an understanding of the state of the first circular pipe 20I and the second circular pipe 20J.

First, multiple circular pipes 20A described in Embodiment 1 are prepared. As illustrated in FIG. 22A, a first circular pipe 20I among the circular pipes 20A is then fitted in the array of the dimples 61 at the rear-right end of the jig 60. The first circular pipe 20I is thereby retained on the jig 60. The position of the first circular pipe 20I is thus determined such that the central axis C of the helix is aligned in the left-right direction as illustrated in FIG. 23A.

As illustrated in FIG. 22B, a second circular pipe 20J different from the first circular pipe 20I is then fitted in the array of the dimples 62 at the rear-right end of the jig 60, which is adjacent to and disposed on the front side of the array of dimples 61 receiving the first circular pipe 20I. The second circular pipe 20J is thus also retained on the jig 60, and the position of the first circular pipe 20J is also determined such that the central axis C of the helix is aligned in the left-right direction.

The step of fitting the first circular pipe 20I in the array of the dimples 61 and the step of fitting the second circular pipe 20J in the array of the dimples 62 are collectively called a circular pipe aligning step in this specification.

In this situation, the second circular pipe 20J is rotated in the clockwise direction. The clockwise direction indicates the clockwise direction when viewed from the left side of the second circular pipe 20J to the right side, that is, when viewed from the –X side to the +X side, as in the description of Embodiment 1.

Figure 23B:
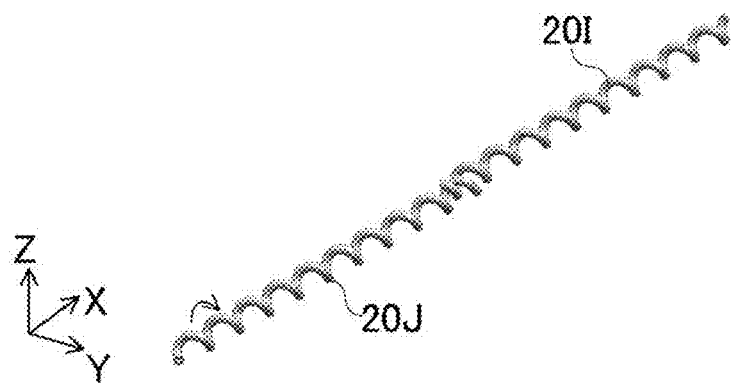
FIG. 23B is a perspective view of the circular pipes after the second circular pipe is rotated such that the right end of the second circular pipe is twined with the left end of the first circular pipe in the flow path forming step involved in the method of manufacturing the heat sink according to Embodiment 8 of the present disclosure.

FIG. 23B is a perspective view of the circular pipes 20I and 20J after the second circular pipe 20J is rotated such that the right end of the second circular pipe 20J is twined with the left end of the first circular pipe 20I.

When the second circular pipe 20J is rotated in the clockwise direction, the second circular pipe 20J is guided by the dimples 62 while being disposed in the dimples 62 on the jig 60. The second circular pipe 20J accordingly shifts in the right direction. In response to every rightward shift of the second circular pipe 20J by the pitch P, the dimples 62 guide the second circular pipe 20J to a position so as to cause the second circular pipe 20J to be twined with the first circular pipe 20I fitted in the dimples 61. The second circular pipe 20J is thereby gradually twined with the first circular pipe 20I. In the first stage, the right end of the second circular pipe 20J is twined with the left end of the first circular pipe 20I, as illustrated in FIG. 23B.

The circular pipes 20I and 20J are exemplary first and second pipes, respectively, in this specification. The step of twining the right end of the second circular pipe 20J with the left end of the first circular pipe 20I is an exemplary step of arranging the first pipe and the second pipe in this specification. This step is also called a pipe arranging step in this specification.

Figure 22C:
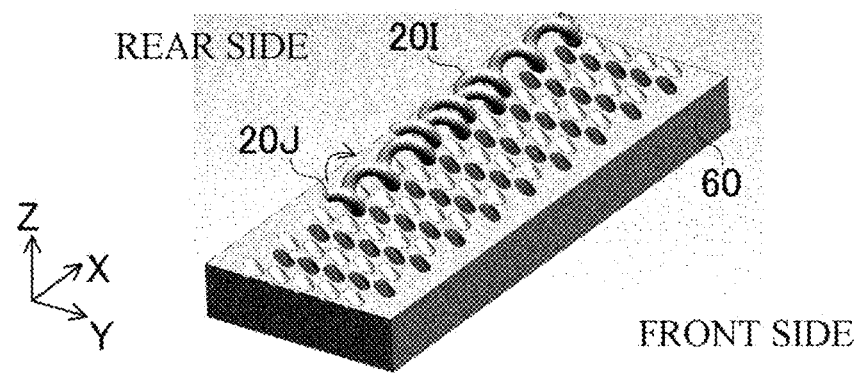
FIG. 22C is a perspective view of the jig used in the method of manufacturing the heat sink according to Embodiment 8 of the present disclosure after the second circular pipe is rotated on the jig so as to be twined with the left half of the first circular pipe.
Figure 22D:
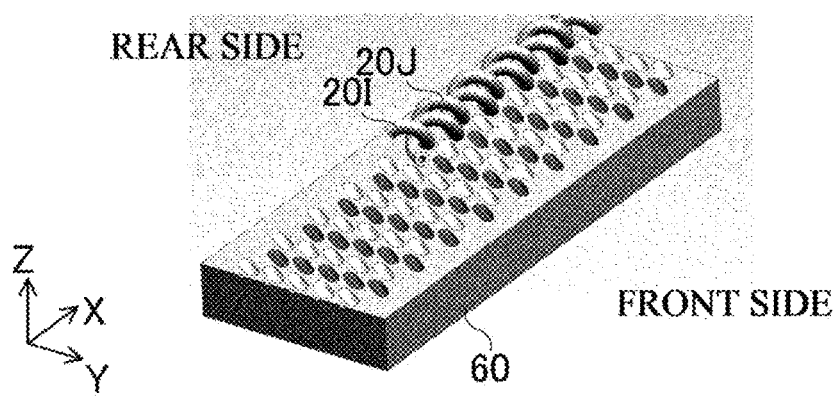
FIG. 22D is a perspective view of the jig used in the method of manufacturing the heat sink according to Embodiment 8 of the present disclosure after the second circular pipe is further rotated on the jig so as to be twined with the entire first circular pipe.

FIG. 22C is a perspective view of the jig 60 after the second circular pipe 20J is rotated on the jig 60 so as to be twined with the left half of the first circular pipe 20I. FIG. 22D is a perspective view of the jig 60 after the second circular pipe 20J is further rotated on the jig 60 so as to be twined with the entire first circular pipe 20I.

Figure 23C:
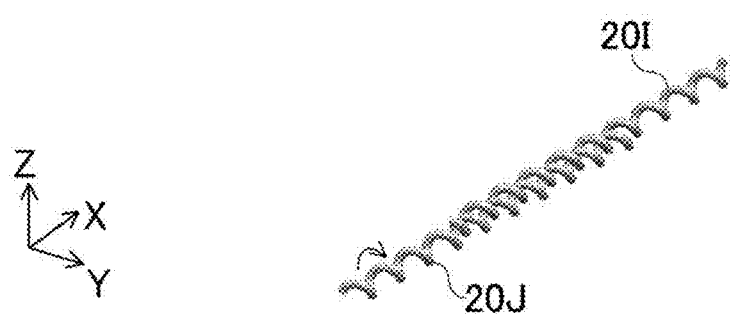
FIG. 23C is a perspective view of the circular pipes after the second circular pipe is further rotated so as to be twined with the left half of the first circular pipe in the flow path forming step involved in the method of manufacturing the heat sink according to Embodiment 8 of the present disclosure.
Figure 23D:
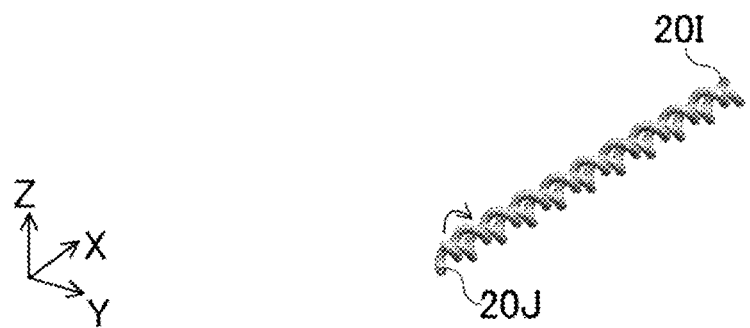
FIG. 23D is a perspective view of the circular pipes after the second circular pipe is further rotated so as to be twined with the entire first circular pipe in the flow path forming step involved in the method of manufacturing the heat sink according to Embodiment 8 of the present disclosure.

FIG. 23C is a perspective view of the circular pipes 20I and 20J after the second circular pipe 20J is further rotated so as to be twined with the left half of the first circular pipe 20I. FIG. 23D is a perspective view of the circular pipes 20I and 20J after the second circular pipe 20J is further rotated so as to be twined with the entire first circular pipe 20I.

When the second circular pipe 20J is rotated in the clockwise direction, the right end of the second circular pipe 20J is twined with the left end of the first circular pipe 20I, as illustrated in FIG. 23B. The further rotation of the second circular pipe 20J causes the second circular pipe 20J to be further twined with the first circular pipe 20I. The second circular pipe 20J is first twined with the left half of the first circular pipe 20I as illustrated in FIGS. 22C and 23C, and then twined with the entire first circular pipe 20I, as illustrated in FIGS. 22D and 23D.

The step of twining the second circular pipe 20J with the entire first circular pipe 20I is an exemplary step of twining the second pipe with the first pipe in this specification. This step is also called a weaving step because this step involves alternately combining the second circular pipe 20J and the first circular pipe 20I to form, that is, weave a single product.

Then, a third circular pipe 20A is fitted in the array of the dimples 61 adjacent to and disposed on the front side of the array of dimples 62 receiving the second circular pipe 20J. This third circular pipe 20A is then twined with the entire second circular pipe 20J through the above-described circular pipe aligning step, pipe arranging step, and weaving step. These steps are further repeated.

Figure 22E:
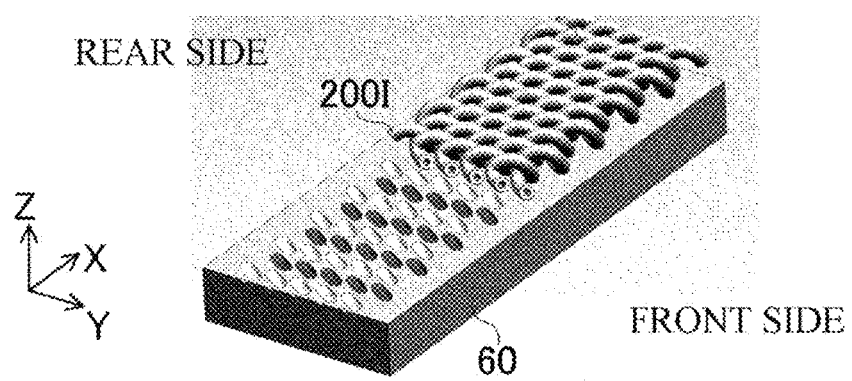
FIG. 22E is a perspective view of the jig used in the method of manufacturing the heat sink according to Embodiment 8 of the present disclosure after a circular pipe array is configured by intertwining a large number of circular pipes with each other on the jig.

FIG. 22E is a perspective view of the jig 60 after a circular pipe array 200I is yielded by intertwining a large number of circular pipes 20I and 20J with each other on the jig 60.

The repetition of the above-described circular pipe aligning step, pipe arranging step, and weaving step produces the circular pipe array 200I illustrated in FIG. 22E. After the circular pipe array 200I is produced, the resulting circular pipe array 200I is removed from the jig 60.

The circular pipe array 200I removed from the jig 60 is then inserted in the metal material through casting. This process completes the heat sink 1A.

As described above, in the method of manufacturing the heat sink according to Embodiment 8, the flow path forming step is executed using the jig 60. The jig 60 retains multiple circular pipes 20I and 20J having a helical shape such that the circular pipes 20I and 20J are rotatable about their central axes of the helices. When the second circular pipe 20J is rotated around the central axis of the helix while the first circular pipe 20I is held at a certain position, the jig 60 guides the second circular pipe 20J to a position so as to cause the second circular pipe 20J to be twined with the first circular pipe 20I. The method of manufacturing the heat sink according to Embodiment 8 can thus readily cause the circular pipes 20I and 20J to be intertwined with one another to yield the circular pipe array 200I.

Embodiment 9

In the method of manufacturing the heat sink 1B according to Embodiment 2, the circular pipes 20B are plated in order to avoid corrosion due to mutually different metal materials constituting the main body 10B and the circular pipes 20B. This manufacturing method is, however, a mere example for avoiding corrosion due to mutually different materials constituting the main body 10B and the circular pipes 20B. A method of manufacturing a heat sink 1K according to Embodiment 9 involves, after inserting a circular pipe array 200K in a metal material constituting a main body 10K through casting to yield the main body 10K, a step of dissolving circular pipes 20K and thereby removing the circular pipes 20K.

The method of manufacturing the heat sink 1K according to Embodiment 9 is described below with reference to FIGS. 24A, 24B, 25A, and 25B. The description of Embodiment 9 is mainly directed to the differences from Embodiments 1 to 8.

Figure 24A:
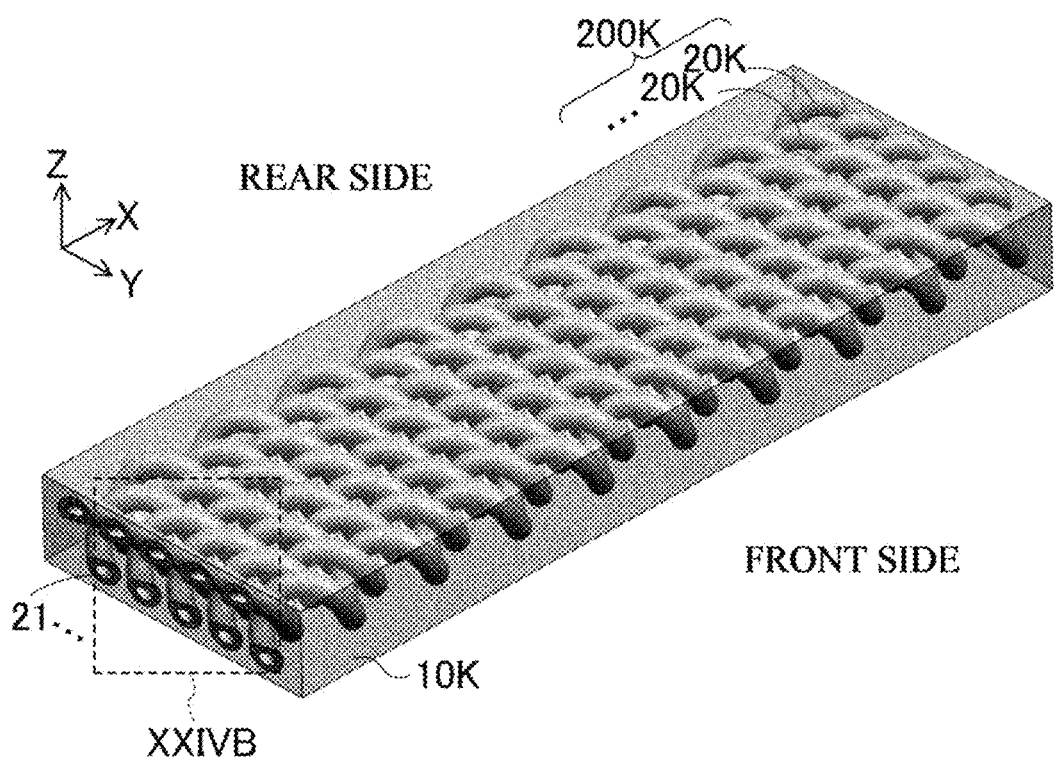
FIG. 24A is a perspective view of a main body fabricated by inserting a circular pipe array in a metal material, which constitutes the main body, through casting in a method of manufacturing the heat sink according to Embodiment 9 of the present disclosure.
Figure 24B:
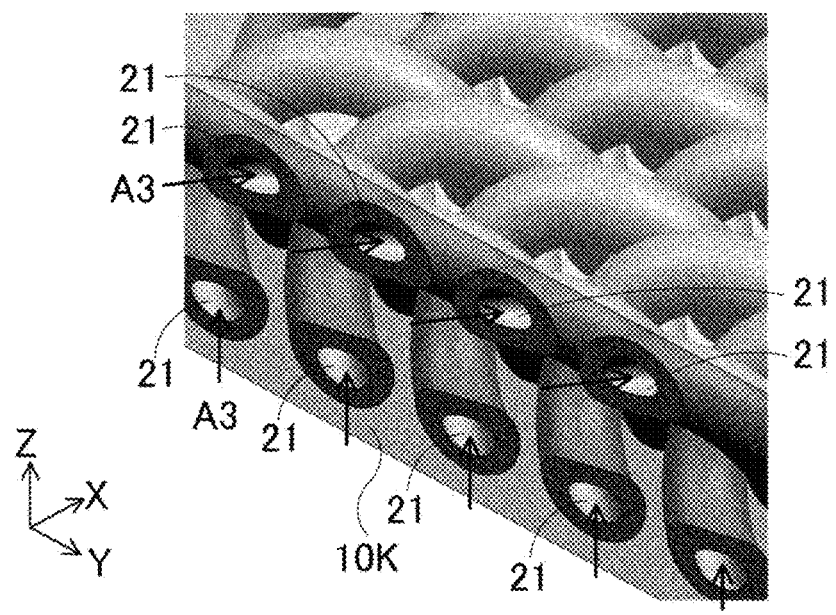
FIG. 24B is an enlarged view of the region XXIVB of FIG. 24A.
Figure 25A:
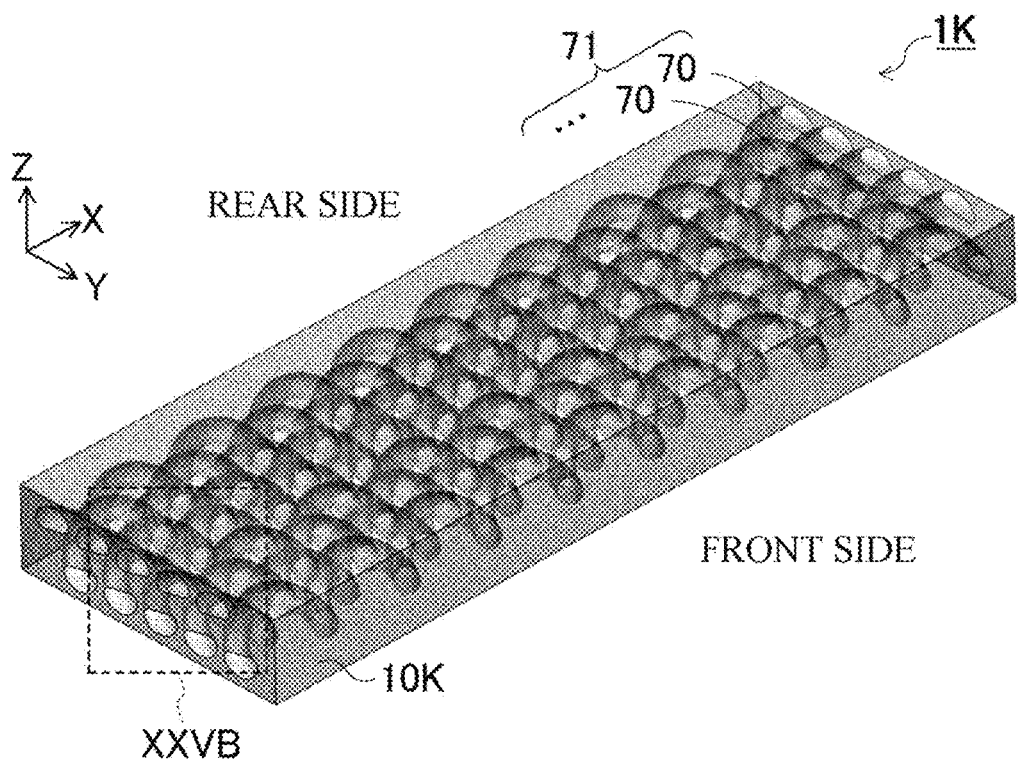
FIG. 25A is a perspective view of the main body after removal of the circular pipe array by dissolution of the circular pipe array in the method of manufacturing the heat sink according to Embodiment 9 of the present disclosure.
Figure 25B:
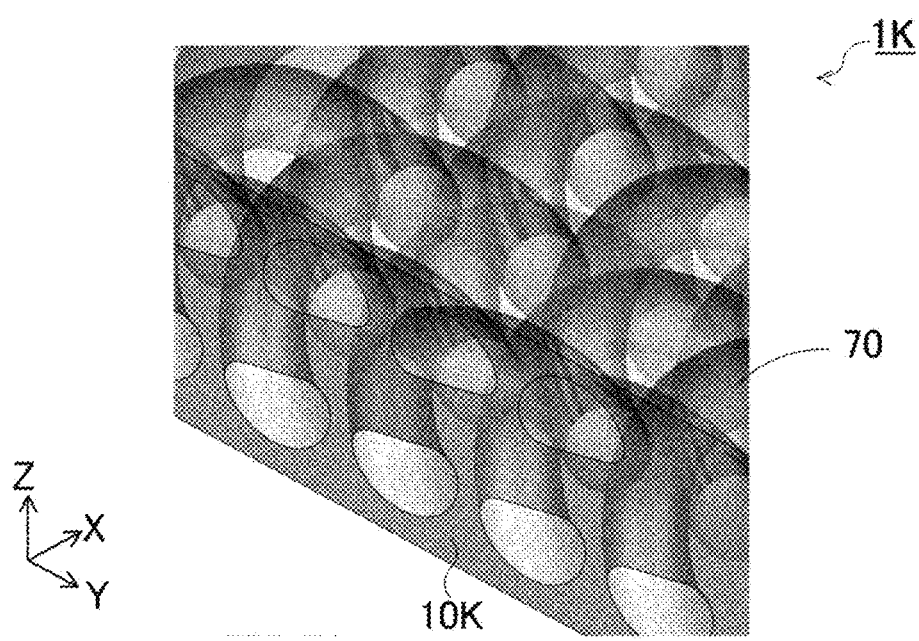
FIG. 25B is an enlarged view of the region XXVB of FIG. 25A.

FIG. 24A is a perspective view of a main body 10K fabricated by inserting the circular pipe array 200K in a metal material, which constitutes the main body 10K, through casting in the method of manufacturing the heat sink 1K according to Embodiment 9. FIG. 24B is an enlarged view of the region XXIVB of FIG. 24A. FIG. 25A is a perspective view of the main body 10K after removal of the circular pipe array 200K by dissolution of the circular pipe array 200K in this manufacturing method. FIG. 25B is an enlarged view of the region XXVB of FIG. 25A. FIGS. 24A, 24B, 25A, and 25B illustrate the main body 10K in translucent gray so as to expose a circular pipe array 200K therein in order to facilitate an understanding.

In the method of manufacturing the heat sink 1K, circular pipes 20K having the shape identical to that in Embodiment 1 are prepared with a certain metal material, such as iron and steel material. The resulting circular pipes 20K are intertwined with one another to yield a circular pipe array 200K. This circular pipe array 200K is then inserted in another metal material, such as aluminum alloy, through casting. This process produces a main body 10K illustrated in FIG. 24A.

In the case where the circular pipe array 200K and the main body 10K are made of mutually different metal materials and these metal materials have a significant difference in ionization tendency, potential differences occur between the circular pipe array 200K and the main body 10K and induce current flows therebetween, as mentioned in Embodiment 2. These current flows may result in corrosion in the circular pipe array 200K and the main body 10K.

In order to solve this problem, a solution, such as hydrochloric acid, sulfuric acid, or nitro-hydrochloric acid, for dissolving the metal material constituting the circular pipes 20K is introduced as represented by the arrows A3 through the openings of the circular pipes 20K, that is, the supply ports 21 illustrated in FIGS. 24A and 24B, exposed at the end surface of the produced main body 10K, in the method of manufacturing the heat sink 1K. This process dissolves the metal material constituting the circular pipes 20K.

The dissolution of the metal material constituting the circular pipes 20K leads to removal of the circular pipes 20K from the main body 10K, as illustrated in FIGS. 25A and 25B. This process completes the heat sink 1K.

This manufacturing process provides the heat sink 1K with flow paths 70 having inner walls made of the material identical to the metal material constituting the main body 10K. The process also provides the main body 10K with a flow path array 71 including the flow paths 70 intertwined with one another. Since the flow path array 71 has an inner wall made of the metal material identical to that of the main body 10K, the flow paths 70 and the main body 10K have no potential difference therebetween and do not cause a current flow. The heat sink 1K is therefore free from corrosion due to a potential difference.

The metal material constituting the main body 10K is an exemplary first metal material in this specification. The metal material constituting the circular pipes 20K is an exemplary fourth metal material in this specification. The hydrochloric acid, sulfuric acid, and nitro-hydrochloric acid are exemplary solutions in this specification.

As described above, the method of manufacturing the heat sink 1K according to Embodiment 9 involves a step of introducing a solution for dissolving the metal material constituting the circular pipes 20K into the circular pipes 20K, dissolving the metal material constituting the circular pipes 20K, and thereby removing the circular pipes 20K from the main body 10K. In the resulting heat sink 1K, the inner walls of the flow paths 70 and the main body 10K are made of the same material. This heat sink 1K can therefore avoid corrosion due to a difference in ionization tendency between the materials constituting the inner walls of the flow paths 70 and the main body 10K.

Although the heat sinks 1A, 1B, 1D to 1H, and 1K for air-conditioning apparatuses are described above according to embodiments of the present disclosure, these heat sinks 1A, 1B, 1D to 1H, and 1K are mere examples. For example, although the flow paths for refrigerant are defined by the circular pipes 20A to 20D and 20F to 20J in Embodiments 1 to 8, these flow paths for the refrigerant are mere examples. What is required is that flow paths extend in a shape of helices and flow paths of which the central axes of the helices are adjacent to each other are intertwined with each other, for example. That is, the flow paths may have any sectional shape, in other words, any pipe sectional shape. For example, the flow paths may be defined by flat pipes having a flattened pipe sectional shape.

The flow paths are not necessarily defined by pipes. In other words, the flow paths are not required to be independent from the main bodies 10A, 10B, 10D, 10F, 10G, 10H, and 10K. The flow paths may be the flow paths formed in the main bodies 10A, 10B, 10D, 10F, 10G, 10H, and 10K, as in Embodiments 5 and 9.

In Embodiments 1 to 9, the central axes C of the helices of the circular pipes 20A to 20D and 20F to 20K are parallel to one another. In other words, the flow paths having a helical shape are arranged such that the central axes of the helices are parallel to one another. These flow paths are, however, mere examples. In an exemplary case where the helices of the circular pipes 20A to 20D and 20F to 20K are not normal helices, in detail, the helices of the circular pipes 20A to 20D and 20F to 20K have an outer diameter $\varphi_2$ gradually increasing in a certain direction along each of the central axes C of the helices, the central axis C of the helix of one of the circular pipes 20A to 20D and 20F to 20K may be inclined from the central axis C of the helix of an adjacent one of the circular pipes 20A to 20D and 20F to 20K.

In Embodiments 1 to 9, the adjacent circular pipes 20A to 20D and 20F to 20K are intertwined with one another every one cycle of the helices. In other words, the adjacent flow paths are intertwined with one another every one cycle of the helix. These flow paths are, however, mere examples. For example, the adjacent flow paths may also be intertwined with one another once in every any integral number of cycles equal to or larger than two cycles. In this case, the helix of one of the adjacent flow paths preferably has a cycle equal to the value calculated by multiplying the cycle of the helix of the other flow path by the integral number equal to or larger than two. In another case where the helices of the flow paths have an outer diameter $\varphi_2$ increasing or decreasing once in every integral number of cycles equal to or larger than two cycles, the adjacent flow paths may be intertwined with one another in each of the cycles.

Although the multiple circular pipes 20A to 20D and 20F to 20K are intertwined to configure the net-like circular pipe arrays 200A, 200B, 200D, 200F to 200I, and 200K in Embodiments 1 to 9, the circular pipe arrays 200A, 200B, 200D, 200F to 200I, and 200K may also be called woven pipe arrays. That is because the word "to weave" means alternately combining long and thin materials to form a single product.

In Embodiment 2, the supply flow paths 31 and the discharge flow paths 32, which are made of a metal material having an ionization tendency significantly different from that of the metal material constituting the circular pipes 20B, are provided adjacent to both ends of the circular pipes 20B. The heat sinks 1A, 1B, 1D to 1H, and 1K may, however, have other configurations. In the heat sinks 1A, 1B, 1D to 1H, and 1K, when one part of the flow path is made of a metal material having an ionization tendency different from that of the other part of the flow path, the one part of the flow path is preferably covered with another metal material having an ionization tendency closer to that of the metal material constituting the other part of the flow path than that of the metal material constituting the one part of the flow path. The one part of the flow path may correspond to the inner walls of the circular pipes 20A to 20D and 20F to 20K, and the other part of the flow path may correspond to headers. For example, the one part of the flow path may correspond to the inner walls of the circular pipes 20A, and the other part of the flow path may correspond to the inlet header 41 and the outlet header 42 in Embodiment 4. In this case, the inner walls of the circular pipes 20A are preferably covered with a metal material having an ionization tendency closer to the metal material constituting the inlet header 41 and the outlet header 42 than that of the metal material constituting the circular pipes 20A.

Although the surfaces of the heat sinks 1A, 1B, 1D to 1H, and 1K to be provided with the heat emitters 2A, 2F, 2G, 2H, and 3G face upward in Embodiments 1 to 9, these orientations of the surfaces are determined for descriptive purposes in Embodiments 1 to 9. That is, the surfaces of the heat sinks 1A, 1B, 1D to 1H, and 1K to be provided with the heat emitters 2A, 2F, 2G, 2H, and 3G may face any direction. Also, the circular pipes 20A to 20D and 20F to 20K and the through holes 51 may extend in any direction and may be intertwined with one another in any direction.

Although the heat emitters 2A, 2F, 2G, 2H, and 3G to be cooled are power semiconductor devices in Embodiments 1 to 9, the heat sinks 1A, 1B, 1D to 1H, and 1K may also cool other devices. Examples of the devices to be cooled include central processing units of computers, and semiconductor devices, such as light-emitting diodes. The devices to be cooled may be apparatuses, machines, or devices that emit heat.

In Embodiments 1 to 9, the main bodies 10A, 10B, 10D, 10F, 10G, 10H, and 10K are independent from the components included in devices to be cooled and are dedicated to the heat sinks 1A, 1B, 1D to 1H, and 1K. These main bodies 10A, 10B, 10D, 10F, 10G, 10H, and 10K are, however, mere examples. The main bodies 10A, 10B, 10D, 10F, 10G, 10H, and 10K may also serve as components of the machines or apparatuses to be cooled. In other words, the main bodies 10A, 10B, 10D, 10F, 10G, 10H, and 10K may be installed in the machines or apparatuses to be cooled as components of the machines or apparatuses. For example, the main bodies 10A, 10B, 10D, 10F, 10G, 10H, and 10K may be installed in the machines to be cooled as components, such as housings or bases. Although the main body 10A is also called a block as mentioned in Embodiment 1, in more detail, the main body 10A may be installed in a machine as a block supporting a heat emitting component to be cooled, or as a block constituting a part of a housing accommodating a heat emitting component.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-221661, filed on Dec. 6, 2019, the entire disclosure of which is incorporated by reference herein.

REFERENCE SIGNS LIST

1A, 1B, 1D-1H, 1K Heat sink
2A, 2F, 2G, 2H, 3G Heat emitter
5 Lower surface
10A, 10B, 10D, 10F, 10G, 10H, 10K Main body
11 Upper surface portion
12 Left surface portion
13 Right surface portion
14 Lower surface portion
20A-20D, 20F-20K Circular pipe
21 Supply port
22 Discharge port
23 Coating layer
24 Protrusion
31 Supply flow path
32 Discharge flow path
41 Inlet header
42 Outlet header
43 Inlet pipe
44 Outlet pipe
50 Plate-like member
51 Through hole
60 Jig
61, 62 Dimple
70 Flow path
71 Flow path array
90 Mold
91, 92 Plate
93, 94 Core
95 Pouring gate
101 Front plate
102 Rear plate
200A, 200B, 200D, 200E-200I, 200K Circular pipe array
500 Layered body
911, 921 Recess
A Amplitude
A1, A2 Arrow
B Back-end portion
C Central axis
F Front-end portion
IC Inner circumference
L Length OC Outer circumference
P Pitch
$\varphi_1, \varphi_2$ Outer diameter

The invention claimed is:

1. A heat sink comprising:
a main body in contact with at least one heat emitter; and
a plurality of flow paths disposed inside the main body and extending in a shape of helices, the plurality of flow paths being configured to convey refrigerant, wherein
the plurality of flow paths are arranged such that each central axis of the helices are adjacent to another of the central axes of the helices, and
each two of the plurality of flow paths of which the central axes of the helices are adjacent to each other are intertwined with each other so that a first flow path of the two flow paths and a second flow path of the two flow paths cross over on alternate sides of each other to form a woven shape.

2. The heat sink according to claim 1, wherein
the central axes of the helices are parallel to one another, and
the flow paths of which the central axes of the helices are adjacent to each other are intertwined with each other once in every integral number of cycles of the helices.

3. The heat sink according to claim 1, wherein
each of the plurality of flow paths has a shape of a circular pipe that has a center winding along a helix of the helices corresponding to a respective one of the flow paths, and
when the central axes of the helices extend in an X direction and adjacent in a Y direction, and the X direction and the Y direction are orthogonal to a Z direction,
a pitch of the helices and an amplitude of the helices satisfy Expressions 1 and 2, and
a trajectory of a center of an nth circular pipe in the Y direction satisfies Expressions 3, 4, and 5 on basis of circular measure:

$$P=4\varphi_1(\sigma+1) \quad \text{(Expression 1)}$$

$$A=\varphi_1(\sigma+1) \quad \text{(Expression 2)}$$

$$X=tL \quad \text{(Expression 3)}$$

$$Y=A\cos\{360tL/P+180(n-1)\}+A(n-1) \quad \text{(Expression 4)}$$

$$Z=A\sin\{360tL/P+180(n-1)\} \quad \text{(Expression 5)}$$

where $\varphi_1$ indicates an outer diameter of the circular pipes, L indicates a length of the central axes of the helices, P indicates the pitch of the helices, A indicates the amplitude of the helices, $\sigma$ indicates a distance factor representing a level of a minimum distance between the circular pipes of which the central axes of the helices are adjacent to each other and satisfies an expression $\sigma<1$, and t indicates an intervening variable and satisfies an expression $0 \le t \le 1$.

4. The heat sink according to claim 1, wherein
the main body has a curved surface in contact with the at least one heat emitter, and
the plurality of flow paths are curved and arranged along the curved surface.

5. The heat sink according to claim 1, wherein the at least one heat emitter is a plurality of the heat emitters, and the main body has two surfaces opposite to each other, each of the surfaces being in contact with at least one of the plurality of heat emitters.

6. The heat sink according to claim 1, wherein
the main body is a metal block in which a plurality of metal pipes extend, each of the plurality of metal pipes winding in a helical shape, and
the plurality of flow paths are spaces surrounded by inner walls of the plurality of metal pipes.

7. The heat sink according to claim 6, wherein
the main body is made of a first metal material,
the plurality of metal pipes are made of a second metal material having an ionization tendency higher than an ionization tendency of the first metal material, and
each of the plurality of metal pipes comprises a coating layer covering its inner wall, the coating layer being made of a third metal material, the third metal material having an ionization tendency higher than the ionization tendency of the first metal material and lower than the ionization tendency of the second metal material, and thus having the ionization tendency of the third metal material closer to the ionization tendency of the first metal material than the ionization tendency of the second metal material.

8. The heat sink according to claim 1, wherein each of the plurality of flow paths comprises a protrusion protruding inward from the flow path.

9. The heat sink according to claim 8, wherein the protrusion extends in a conveyance direction of the refrigerant.

10. The heat sink according to claim 8, wherein the protrusion has, in a cross section perpendicular to a conveyance direction of the refrigerant, a shape of a rectangle comprising sharp corners.

11. The heat sink according to claim 8, wherein the protrusion has, in a cross section perpendicular to a conveying direction of the refrigerant, a shape of a rectangle comprising rounded corners.

12. The heat sink according to claim 1, further comprising:
a first header coupled to ends of the plurality of flow paths to which the refrigerant is fed, the first header being configured to distribute the refrigerant to the plurality of flow paths; and
a second header coupled to ends of the plurality of flow paths from which the refrigerant is discharged, the second header being configured to collect the refrigerant from the plurality of flow paths.

13. A method of manufacturing a heat sink, the method comprising:
forming a plurality of flow paths for conveying refrigerant by fabricating a plurality of pipes winding in a shape of helices, the plurality of pipes being arranged such that central axes of the helices are adjacent, each two of the plurality of pipes of which the central axes of the helices are adjacent to each other being intertwined with each other so that a first pipe of the two pipes and a second pipe of the two pipes cross over on alternate sides of each other to form a woven shape; and
inserting, in a first metal material through casting, the plurality of pipes fabricated in the forming.

14. The method according to claim 13, wherein
the forming comprises:
arranging the first pipe and the second pipe such that one end of the second pipe is twined with one end of the first pipe; and
twining the second pipe with the first pipe, by rotating the second pipe around a central axis of a helix of the helices corresponding to the second pipe while holding the first pipe at a certain position and shifting the one end of the second pipe toward another end of the first pipe until the one end of the second pipe is aligned to the another end of the first pipe, the another end of the first pipe being opposite to the one end of the first pipe, wherein the arranging is followed by the twining.

15. The method according to claim 13, wherein, in the forming, the central axes of the helices are made parallel to one another, and the pipes of which the central axes of the helices adjacent to each other are intertwined with each other once in every integral number of cycles of the helices.

16. The method according to claim 13, wherein the plurality of pipes are fabricated with an additive manufacturing device in the forming.

17. The method according to claim 13, wherein the plurality of pipes are fabricated with a second metal material in the forming, and the method further comprises, before the inserting:

plating inner walls of the plurality of pipes with a third metal material having an ionization tendency closer to an ionization tendency of the first metal material than an ionization tendency of the second metal material.

18. The method according to claim 13, wherein the plurality of pipes are fabricated with a second metal material in the forming, and the method further comprises, after the inserting:

removing the plurality of pipes inserted in the inserting from the first metal material, by introducing a solution for dissolving the second metal material into the plurality of pipes and thereby dissolving by the solution the second metal material constituting the plurality of pipes.

19. A method of manufacturing a heat sink, the heat sink including a block and a plurality of flow paths, the plurality of flow paths being disposed inside the block and extending in a shape of helices, the plurality of flow paths being arranged such that central axes of the helices are adjacent, each two of the plurality of flow paths of which the central axes of the helices are adjacent to each other are intertwined with each other so that a first flow path of the two flow paths and a second flow path of the two flow paths cross over on alternate sides of each other to form a woven shape, the method comprising:

fabricating a plurality of plate-like members each having a plate surface perpendicular to the central axes of the helices and form parts of the plurality of flow paths; and configuring the block comprising the plurality of flow paths by stacking the plurality of plate-like members on each other.

* * * * *